US006884648B2

(12) United States Patent
Hasegawa et al.

(10) Patent No.: US 6,884,648 B2
(45) Date of Patent: Apr. 26, 2005

(54) METHOD FOR FABRICATING SEMICONDUCTOR LIGHT EMITTING DEVICE

(75) Inventors: Yoshiaki Hasegawa, Katano (JP); Toshitaka Shimamoto, Matsubara (JP); Gaku Sugahara, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/687,647

(22) Filed: Oct. 20, 2003

(65) Prior Publication Data

US 2004/0115847 A1 Jun. 17, 2004

Related U.S. Application Data

(63) Continuation of application No. PCT/JP02/11225, filed on Oct. 29, 2002.

(30) Foreign Application Priority Data

Oct. 29, 2001 (JP) ........................................ 2001-330437

(51) Int. Cl.[7] .............................................. H01L 21/00
(52) U.S. Cl. .............................. 438/46; 438/34; 438/39; 438/42
(58) Field of Search ........................... 438/22, 29, 34, 438/39, 41, 42, 44, 46, 47

(56) References Cited

U.S. PATENT DOCUMENTS

| 5,757,833 | A | | 5/1998 | Arakawa et al. | |
|---|---|---|---|---|---|
| 6,355,497 | B1 | * | 3/2002 | Romano et al. | 438/39 |
| 6,562,701 | B2 | * | 5/2003 | Ishida et al. | 438/33 |
| 6,577,006 | B1 | * | 6/2003 | Oota et al. | 438/24 |
| 6,756,245 | B2 | * | 6/2004 | Ohbo et al. | 438/46 |

FOREIGN PATENT DOCUMENTS

| JP | 63-1370 | 1/1988 |
|---|---|---|
| JP | 63-34992 | 2/1988 |

(Continued)

OTHER PUBLICATIONS

Shuji Nakamura, "InGaN Multiquantium– Well–Structure Laser Diodes with GaN–AlGaN Modulation–Doped Strained–Layer Superlatticses", IEEE Journal of Selected Topics in Quantum Electronics, vol. 4, No. 3, May/Jun. 1998, p. 483–489.

(Continued)

Primary Examiner—Kevin M. Picardat
(74) Attorney, Agent, or Firm—McDermott Will & Emery LLP

(57) ABSTRACT

A method for fabricating a semiconductor light emitting device, the method comprising the steps of: repeatedly forming, on a first nitride based Group III–V compound semiconductor layer, stripe-shaped masking films in a predetermined cycle in a width-wise direction thereof, each masking film comprising first width sections having a predetermined width and second width sections which are adjacent to both ends of each first width section and have a greater width than the predetermined width; selectively growing a second nitride based Group III–V compound semiconductor layer from exposed parts of a surface of the first nitride based Group III–V compound semiconductor so as to cover the masking films and the exposed parts, each of the exposed parts being located between the masking films; and layering a semiconductor laser structure on the second nitride based Group III–V compound semiconductor layer, the semiconductor laser structure including an active layer which substantially extends in a length-wise direction of the masking films and level difference portions which extend in the width-wise direction by a structure in which a portion located above the second width sections is lower than a portion located above the first width sections.

20 Claims, 20 Drawing Sheets

FOREIGN PATENT DOCUMENTS

| JP | 5-259079 | 10/1993 |
| JP | 5-343813 | 12/1993 |
| JP | 9-191150 | 7/1997 |
| JP | P2000-196188 A | 7/2000 |
| JP | P2001-244560 A | 9/2001 |

OTHER PUBLICATIONS

H. Marchand, et al., "Mechanisms of Lateral Expilaxial Overgrowth of Gallium Nitride by Metalorganic Chemical Vapor Deposition", Journal of Crystal Growth, 195 (1998) 328–332.

Michael Kneissl, et al., "Performance and Degradation of Continuous–wave InGaN Mutiple–Quantum–Well Laser Diodes on Epitaxially Laterally Overgrown GaN Substrates", Applied Physics Letters, vol. 77, No. 13, Sep. 25, 2000, pp. 1931–1933.

Shuji Nakamura, "UV/Blue/Green InGaN–Based LEDs and Laser Diodes Grown on Epitaxially Laterally Overgrown GaN", IEICE Trans. Electron., Vo.E83–C, No. 4, Apr. 2000, p. 529–535.

Shuji Nakamura, et al., "InGaN/GaNAL/GaN–Based Laser Diodes with Modulation–Doped Strained–Layer Superlatices Grown on an Epitaxially Laterally Overgrown GaN Substrate", Applied Physics Letters, vol. 72, No. 2, pp. 211–213 (1998).

* cited by examiner

METHOD FOR FABRICATING SEMICONDUCTOR LIGHT EMITTING DEVICE

This is a continuation application under 35 U.S.C 111(a) of pending prior International Application No.PCT/JP02/11225, filed on Oct. 29, 2002.

BACKGROUND OF THE INVENTION

1. Field of the Invention

The present invention relates to a semiconductor light emitting device which is composed of a nitride based Group III–V compound semiconductor and produces radiant energy in the short wavelength region covering blue-violet radiation to ultraviolet radiation and a method for fabricating the same.

2. Description of the Related Art

Recently, with an increasing demand for blue-violet light emitting laser diodes which serve as next generation light sources for high-density optical disks, tremendous research effort has been being directed to development of gallium nitride (GaN) based Group III–V compound semiconductor light emitting devices which emit light in the short wavelength region covering blue-violet radiation to ultraviolet radiation. Since the optical disk systems are expected to perform higher-density and higher-speed recording as a recorder, there have arisen a need for GaN based semiconductor lasers having high optical power and high reliability.

As an attempt to increase the service life of a GaN based laser and thereby provide high reliability, there has been used a technique in which an insulating film made from silicon dioxide ($SiO_2$) or the like is deposited on a GaN based semiconductor grown on a sapphire substrate and the GaN based semiconductors is selectively grown on this insulating film, thereby reducing the dislocation density. This selective growth is reported in "IEEE Journal of Selected Topics in Quantum Electronics, Vol. 4 (1998) 483–489" (the first literature) and "Journal of Crystal Growth, Vol. 195 (1998) 328–332" (the second literature). According to the first literature, an $SiO_2$ film is cyclically formed in a line and space pattern in the <1–100> direction of GaN so that the GaN based semiconductor layers selectively grown are planarized and linked together and the product thus formed can be used as a low dislocation density substrate. While direction indices and mirror indices are normally represented by putting a bar mark (–) on top of a figure, a minus symbol (–) is put, in this specification, before a figure (e.g., "–1" in the <1–100> direction). The second literature teaches that the growing speeds of the selectively grown GaN in a direction (hereinafter referred to as "substrate perpendicular direction") perpendicular to the substrate and in a direction (hereinafter referred to as "substrate parallel direction") parallel with the substrate are dependent of an open area ratio (Ws/(W1+Ws)) which is the ratio of an open area (width: Ws) to the sum of an area (width: W1) covered with the $SiO_2$ film and the open area (width: Ws). Applications in which the technique of selective growth is used for a laser have been reported in "Applied Physics Letters, Vol. 77 (2000), 1931–1933" (the third literature) and "IEICE Transuction Electron, Vol. E83-C (2000) 529–535" (the fourth literature). According to the third literature, the dislocation density of a laser structure can be reduced from about $1E10\ cm^{-2}$ to about $1E7\ cm^{-2}$ by the selective growth. The fourth literature discusses that, by reducing dislocation density to the same degree as described earlier through selective growth with an open area ratio (Ws/W1+Ws) of 0.33 which corresponds to the case where the line width W1 of the $SiO_2$ film is 8 µm and the width of the open area is 4 µm, the threshold current of the laser can be reduced and the service life can be increased in the order of 1,000 hours.

It is generally known that if a semiconductor laser is operated to output high optical power, there occurs Catastrophic Optical Damage (COD), that is, localized thermal destruction of the facets of a laser. Since many surface levels exist at the laser facets, many non-radiative recombinations occur through the surface levels. Therefore, injected carrier density decreases at the laser facets so that the laser facets become laser radiation absorbing regions and, in consequence, localized heating at the facets becomes significant. This is the phenomenon called "COD". It has been thought that COD does not occur GaN based lasers, because the material, GaN is strong. However, the fourth literature "IEICE Transuction Electron, Vol. 77 Vol. E83-C (2000) 529–535" has reported by way of an actual example that if a GaN-based laser is operated to output an optical power as high as 30 mW, COD will occur, causing deterioration of the laser facets.

As measures to prevent COD, there have been employed a technique for facilitating dissipation of heat from a laser and a technique for providing the so-called window structure for laser facets. As the technique for facilitating dissipation of heat from a laser of these techniques, in the case of a semiconductor laser for outputting high optical power, packaging in which the semiconductor laser is mounted (p-side down) by means of a solder or sub-mount with the pn junction side thereof being close to the heat sink in order to effectively dissipate heat generated in high optical power operation toward the heat sink is effective. However, this packaging should be carefully done by keeping a space between the solder and the outputting facet in order to prevent the solder from sticking to the outputting facet. Therefore, even if p-side down packaging is carried out, heat dissipation slows down in the vicinity of the laser facet, increasing the likelihood of occurrence of COD.

On the other hand, the technique of providing the so-called window structure for laser facets is not generally employed in GaN based lasers, because the material of the lasers, GaN is too hard to make a window structure. A case where a window structure is provided for a GaN based laser is described in Japanese Patent Kokai Publication No. 2000-196188. In the current development of GaN based lasers intended for outputting of high optical power, attempts have been made to prevent occurrence of COD at laser facets by restraining overall heat generation in a laser through power consumption saving by a reduction in the operating current and operating voltage of the laser.

However, there is a limit in the restraint of overall heat generation in lasers for the next generation optical disk systems which seek higher density and higher speed recording, so that there still remains the problem of laser degradation due to occurrence of COD.

SUMMARY OF THE INVENTION

After making much research effort to solve the foregoing problems, the inventors have found that a high optical power GaN-based laser suited for high-density, high-speed recording can be manufactured with high yields at low cost, by fundamentally restraining occurrence of COD through simultaneous formation of a low dislocation density structure and a facet window structure at the time of crystal growth in a GaN based laser.

According to the invention, there is provided a method for fabricating a semiconductor light emitting device, the method comprising the steps of:

(A) repeatedly forming, on a first nitride based Group III–V compound semiconductor layer, stripe-shaped masking films in a predetermined cycle in a width-wise direction thereof, each masking film comprising first width sections having a predetermined width and second width sections which are adjacent to both ends of each first width section and have a greater width than the predetermined width;

(B) selectively growing a second nitride based Group III–V compound semiconductor layer from exposed parts of the first nitride based Group III–V compound semiconductor so as to cover the masking films and the exposed parts, each of the exposed parts being located between the masking films; and (C) layering a semiconductor laser structure on the second nitride based Group III–V compound semiconductor layer, the semiconductor laser structure including an active layer which substantially extends in the length-wise direction of the masking films and level difference portions which extend in the width-wise direction by a structure which a portion located above the second width sections is lower than a portion located above the first width sections. Herein, the level difference portions may be stepped, sloped or curved.

With this arrangement, the film thickness of the second nitride based Group III–V compound semiconductor layer varies between the portion located above the first width sections of the masking films and the portion located above the second width sections of the same, according to the open area ratio of the whole masking films which corresponds to the difference in width between the first and second width sections of each masking film. The difference in film thickness reflects on the semiconductor laser structure to be layered on the second nitride based Group III–V compound semiconductor layer, so that a level difference portion of the layered layers is formed on the boundary between each first width section and each second width section. By utilizing these level difference portions, the facet window structure for the semiconductor laser structure can be obtained. In addition, since the second nitride based Group III–V compound semiconductor layer serving as a foundation layer for the semiconductor laser structure becomes a low dislocation density structure through selective growth by use of the masking films, suppression of dislocations in the semiconductor laser structure itself can be realized.

In the semiconductor laser structure, the level difference portions may be formed such that the active layer of the portion located above the first width sections is joined to other semiconductor layers than the active layer of the portion located above the second width sections. With this arrangement, deterioration of heat dissipation due to imperfect bonding of the solder at the time of packaging can be prevented.

In the semiconductor laser structure, the level difference portions may be formed such that the active layer of the portion located above the first width sections is joined to other semiconductor layers than the active layer of the portion located above the second width sections.

In addition, in the semiconductor laser structure, the level difference portions may be formed such that the active layer of the portion located above the first width sections is joined to a semiconductor layer having higher bandgap energy than the active layer of the portion located above the second width sections. With this arrangement, the amount of laser light absorbed at the portion located above the second width sections which serves as a resonator end portion can be reduced.

The semiconductor laser structure may include cladding layers between which the active layer is sandwiched in a layering direction and the semiconductor layer having higher bandgap energy than the active layer may be the cladding layers. With this arrangement, a semiconductor layer having high bandgap energy and joined to the active layer at a end portion of the resonator can be easily attained.

Each of the masking films may consist of an insulating film.

When layering the semiconductor laser structure in the step (C), ridges may be formed to extend in the length-wise direction of the masking films and are located above the respective masking films. With this arrangement, the light emitting section of the semiconductor laser is located on the second nitride based Group III–V compound semiconductor layer having low dislocation density and located on the masking films, so that the service life of the semiconductor laser can be increased.

Preferably, the difference in width between the first width sections and second width sections of the masking films is 16% or more and 84% or less of the predetermined width of the first width sections. This makes it possible to suitably form the level difference portions in the layered layers of the semiconductor laser structure.

In the semiconductor laser structure, a percentage of a distance between a facet of a resonator to the level difference portion to a length of the resonator is preferably 10% or less. This prevents an increase in threshold current caused by substantial shortening of the resonator.

Further, the portion of the semiconductor laser structure located above the second width sections may have a current non-injection structure. With this arrangement, heat generation caused by current injection at the laser facets can be restrained so that facet deterioration such as COD can be restrained. As a result, high optical power and long service life can be achieved.

The current non-injection structure may be obtained by forming no electrodes at the portion of the semiconductor laser structure located above the second width sections.

The current non-injection structure may be obtained by forming an insulating layer under an electrode at the portion of the semiconductor laser structure located above the second width sections.

In the semiconductor laser structure, a region where a dielectric film for coating a facet of the resonator is adhered may be located within the portion located above the second width sections. If a semiconductor laser structure grown on the main surface of the substrate is mounted on a sub-mount by means of solder, heat dissipation degrades in this region because the dielectric film adhered to the main surface of the substrate is imperfectly bonded to the solder. Therefore, this region is located within the portion of the semiconductor laser structure located above the second width sections which is a current non-injection region, whereby heat generation caused by current injection is prevented to obviate the cause of deterioration of heat dissipation with the result that high optical power and long service life can be ensured.

The dielectric film may be a dielectric multilayer film which behaves as a highly reflective film to laser light generated in the laser structure.

The dielectric film may behave as a low reflective film to laser light generated in the laser structure.

The dielectric film may be a film for protecting a facet of the resonator from pollution.

The nitride based Group III–V compound semiconductor may be a GaN semiconductor. A GaN semiconductor is strong and it is therefore difficult to form a facet window structure in a GaN semiconductor by mechanical processing or ion implantation. However, a GaN semiconductor is useful for the invention in which the facet window structure can be formed by utilizing the level difference portions which are formed in the layered layers during the formation process of the semiconductor laser structure.

In addition, the first nitride based Group III–V compound semiconductor layer may be formed on a sapphire substrate.

Preferably, the second nitride based Group III–V compound semiconductor grows from the space between the masking films onto the masking films substantially in parallel with a main surface of the substrate.

Preferably, in the second nitride based Group III–V compound semiconductor layer, a dislocation density of a portion grown on the masking films is lower than the dislocation density of a portion grown between the masking films.

Preferably, the portions of the second nitride based Group III–V compound semiconductor layer which have grown on the respective width sections of the masking films are planarized.

According to the invention, there is provided a semiconductor light emitting device comprising:

a first nitride based Group III–V compound semiconductor layer;

stripe-shaped masking films formed on the first nitride based Group III–V compound semiconductor layer so as to be repeated in a predetermined cycle in a width-wise direction thereof, each masking film comprising first width sections having a predetermined width and second width sections which are adjacent to both ends of each first width section and have a greater width than the predetermined width;

a second nitride based Group III–V compound semiconductor layer which has been grown from exposed parts of the first nitride based Group III–V compound semiconductor layer so as to cover the masking films and the exposed parts, each of the exposed parts being located between the masking films; and a semiconductor laser structure layered on the second nitride based Group III–V compound semiconductor layer, the semiconductor laser structure including an active layer which substantially extends in a length-wise direction of the masking films and level difference portions which extend in the width-wise direction by a structure in which a portion located above the second width sections is lower than a portion located above the first width sections.

With this arrangement, in the process of formation of the semiconductor laser structure, the second nitride based Group III–V compound semiconductor layer can be selectively grown using the stripe-shaped masking films which have width (open area ratio) varying in a longitudinal (length-wise) direction so that the level difference portions are formed in the layered layers, and by utilizing these level difference portions, a facet window structure can be easily formed. As a result, easy formation of the facet window structure is enabled even in a semiconductor laser composed of a material such as a GaN semiconductor which is strong and has a difficulty in forming the facet window structure therein by mechanical processing or ion implantation. In addition, since the second nitride based Group III–V compound semiconductor layer which is formed through selective growth has the low dislocation density structure, the dislocation of the semiconductor laser structure itself can be reduced.

In a section taken along the length-wise direction, the masking films may be located under the active layer.

These objects as well as other objects, features and advantages of the invention will become apparent to those skilled in the art from the following description with reference to the accompanying drawings.

BRIEF DESCRIPTION OF THE DRAWINGS

FIGS. 8A and 8B are views showing a structure of a selectively grown GaN based laser having different insulating film open area ratios according to the first embodiment of the invention in a longitudinal direction of a resonator, wherein FIG. 8A is a sectional view taken along cutting line VIIIa—VIIIa of FIG. 7K whereas FIG. 8B is a sectional view taken along cutting line VIIIb—VIIIb of FIG. 7K.

DETAILED DESCRIPTION OF PREFERRED EMBODIMENTS

Referring now to the accompanying drawings, preferred embodiments of the invention will be described below.

First, a layered film thickness control method utilizing selective growth will be described, which is a basis for the method for fabricating the semiconductor light emitting device of the invention. According to this layered film thickness control method, in the crystal growth of a GaN based semiconductor, selective growth is done by use of an insulating film having different open area ratios, thereby reducing the dislocation of the layered films and controlling the film thickness.

There will be given a full account of the layered film thickness control method with reference to the drawings.

FIGS. 1A to 1D and 2E to 2H show structural sectional views of a semiconductor constructed with the layered film thickness control method. Firstly, a sapphire substrate 11 having a (0001) surface as a main surface was washed, using an acid solution. Thereafter, the washed substrate 11 was held by a susceptor within the reactor of a metal organic vapor epitaxy (MOVPE) system (not shown) and the reactor was evacuated. Subsequently, a hydrogen atmosphere having a pressure of 300 Torr (1 Torr=133.322 Pa) was established in the reactor. The temperature within the reactor was raised to about 1100° C. to heat the substrate 11 and thermal cleaning of the surface was carried out for about 10 minutes.

Figure 1A:
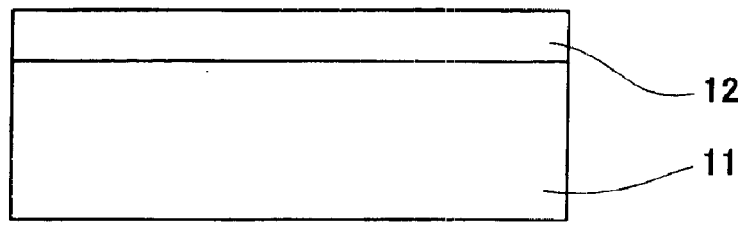
FIGS. 1A to 1D are structural sectional views of a GaN based semiconductor selectively grown on a sapphire substrate in a layered film thickness control method which is a basis for the method for fabricating a semiconductor light emitting device according to the present invention.

After lowering the temperature of the reactor to about 500° C., 7 sccm trimethyl gallium (TMG), 7.5 slm ammonia ($NH_3$) gas and hydrogen serving as a carrier gas were supplied to the main surface of the substrate 11 at the same time, thereby growing a low temperature buffer layer comprised of 20 nm thick GaN. Then, the temperature of the reactor was raised to about 1000° C., thereby growing a GaN layer 12 having a thickness of about 1 μm (FIG. 1A).

Figure 1B:
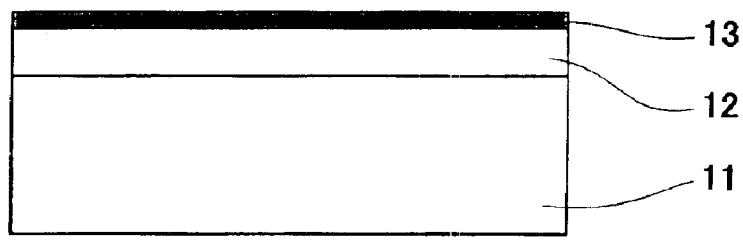
Figure 1C:
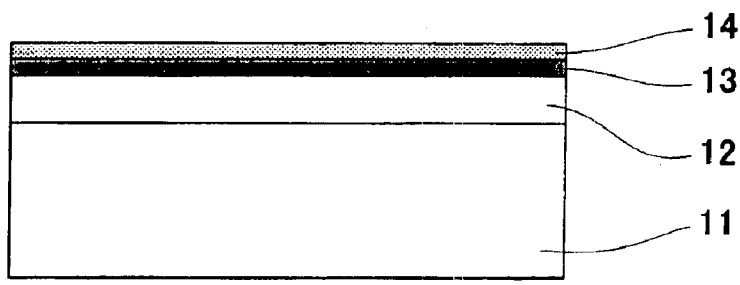
Figure 1D:
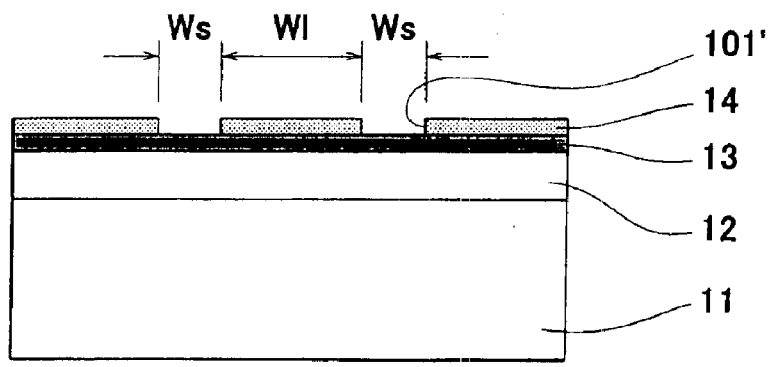
Figure 2E:
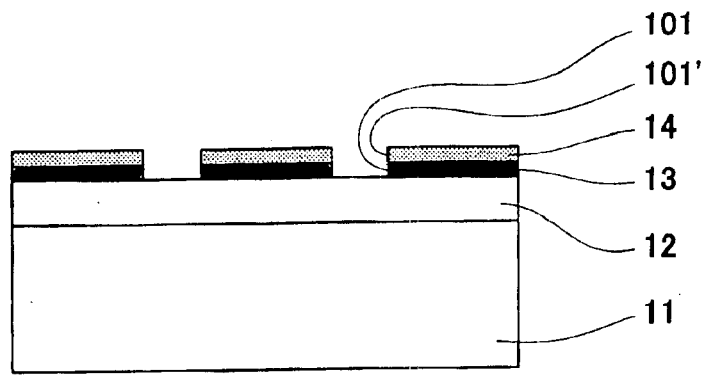
FIGS. 2E to 2H are structural sectional views of the GaN based semiconductor selectively grown on the sapphire substrate in the layered film thickness control method which is a basis for the method for fabricating the semiconductor light emitting device of the present invention.
Figure 2F:
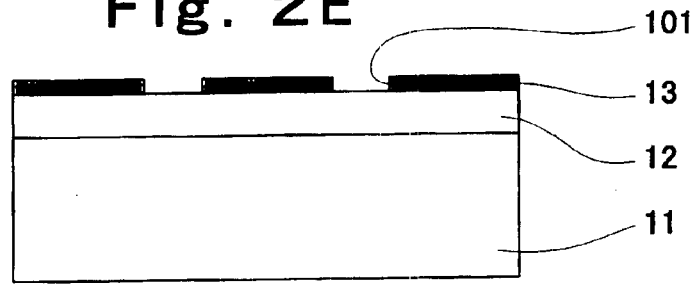

Thereafter, the substrate 11 was taken from the reactor and an insulating film (masking film) 13 for selective growth was formed on the GaN layer 12. Herein, the insulating film 13 was made from silicon dioxide ($SiO_2$) and deposited so as to have a thickness of about 100 nm, using a plasma CVD system (FIG. 1B). Subsequently, a resist film 14 was applied onto the insulating film 13 (FIG. 1C), and striped resist patterns having the following different open area ratios were formed by photolithography (FIG. 1D). (the width (W1) of the resist film 14: the width (Ws) of the area from which the resist is removed, open area ratio)=(3 μm: 15 μm, 0.83), (6 μm: 12 μm, 0.67), (9 μm: 9 μm, 0.50), (12 μm: 6 μm, 0.33), (15 μm: 3 μm, 0.17). These patterns have the same lengthwise direction of the stripe (the <1–100> direction of the GaN film 12) and the same cycle (pitch) P of 18 μm. Each resist pattern is in the form of a block with dimensions of 20 mm by 20 mm. Every adjacent resist patterns are about 5 mm away from each other to prevent them from affecting each other during the selective growth. Then, the insulating film 13 in resist removed portions 101' was removed by a hydrofluoric acid solution using the resist film 14 as an etching mask, so that groove-like openings 101 were formed and the GaN layer 12 was exposed at the bottoms of the openings 101 (FIG. 2E). Subsequently, the resist film 14 was removed by an organic solution such as acetone (FIG. 2F). The width of each stripe portion of the insulating film 13, the width of each opening 101 and the open area ratio of the insulating film 13 thus obtained are substantially the same as the width of each stripe portion of the resist film 14, the width of each opening 101' and the open area ratio of the resist film 14, respectively.

Thereafter, the substrate 11 having the striped insulating film 13 deposited thereon was held by the susceptor within the reactor of the MOVPE system and the reactor was evacuated in order to selectively grow the GaN layer. Then, a hydrogen atmosphere having a pressure of 200 Torr was established within the reactor and the temperature of the reactor was raised to about 1000° C. 7 sccm trimethyl gallium (TMG), 7.5 slm an ammonia gas ($NH_3$) and hydrogen serving as a carrier gas were supplied at the same time, thereby selectively growing a GaN layer 15 for about 4 hours.

Figure 2G:
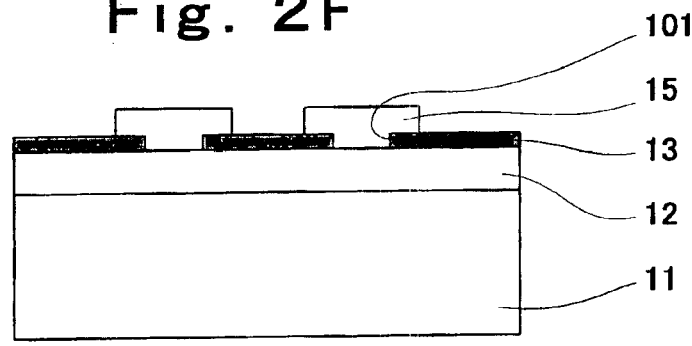
Figure 2H:
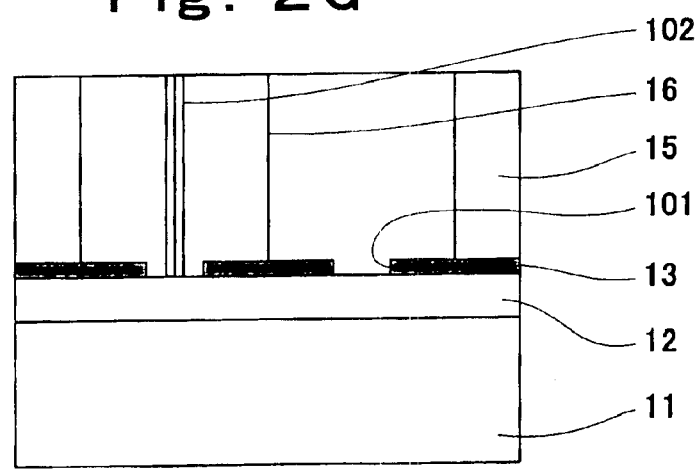
Figure 3:
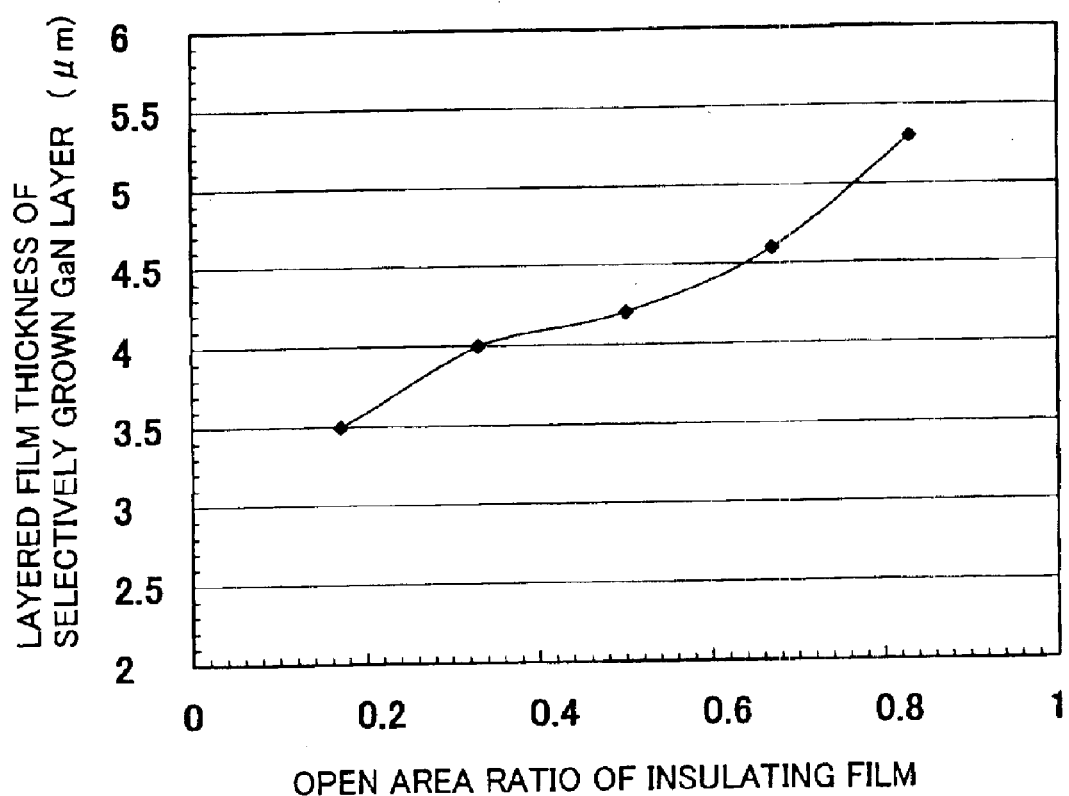
FIG. 3 is a graph showing the relationship between the layered film thickness and insulating film open area ratio of the GaN based semiconductor selectively grown on the sapphire substrate in the layered film thickness control method which is a basis for the method for fabricating the semiconductor light emitting device of the present invention.

After completion of the selective growth, the substrate 11 was taken out of the reactor, and the sectional shape and film thickness of the selectively grown GaN layer 15 was observed using a scanning electron microscope (SEM). As a result, it was found that, in the respective selective grown patterns (the patterns of the insulating film 13 which correspond to the above-described resist patterns having different open area ratios), the portions of the GaN layer expanding from the every adjacent openings 101 of the insulating film 13 onto the insulating film 13 in a lateral direction (i.e., a substrate parallel direction) joined each other, being planarized (FIGS. 2G, 2H). Reference numeral 16 designates the joined parts of the GaN layer 15. Then, the layered film thickness of the GaN layer 15 which had been selectively grown on the insulating film 13 was measured in each selectively grown pattern. FIG. 3 shows the result in a graph which represents the open area ratio dependence of the layered film thickness of the GaN layer 15. It is understood from FIG. 3 that the layered film thickness of the GaN layer 15 monotonously decreases with a decrease in the open area ratio of the insulating layer 13. Therefore, it has been proved possible to vary the layered film thickness of the GaN layer on the insulating film 13, by varying the open area ratio of the insulating film 13 even if the cycle of stripe-shaped portions constituting the striped pattern of the insulating film 13 is constant. This result coincides with the content of the second literature "Journal of Crystal Growth, Vol. 195 (1998) 328–332".

Penetrating dislocation defects were observed, using a transmission electron microscope (TEM).

As a result, it was proved that, at the openings 101 of the insulating film 13, the penetrating dislocation density was about 1E9 cm$^{-2}$ and therefore the dislocation reduction effect could not be achieved, whereas, on the insulating film 13, the penetrating dislocations were bent in a horizontal direction of the substrate so that the penetrating dislocation density was reduced to about 1E7 cm$^{-2}$ (see FIG. 2H. In this figure, numeral 102 represents a penetrating dislocation and penetrating dislocations in other openings 101 than the one shown in the figure are omitted.)

Although the insulating film 13 is used as a masking film for the selective growth of the GaN layer 15 in the present layered film thickness control method, the insulating property is not always required for the masking film and other type of films may be used on condition that they can hamper the epitaxial growth of the GaN layer 15 on them.

First Embodiment

The first embodiment of the invention is associated with a method for fabricating a GaN based semiconductor laser, wherein both the low dislocation density structure and the facet window structure useful for suppression of COD generation at the laser resonator facets are achieved with high yields at low cost by carrying out selective growth, in the crystal growth of a semiconductor laser, through the above layered film thickness control method using an insulating film having different open area ratios.

Referring to the drawings, the method for fabricating a GaN based semiconductor laser will be hereinafter described in detail according to the first embodiment of the invention.

FIGS. 4A to 7K show, in the order of processing, structural sectional views of a semiconductor laser according to this embodiment.

A sapphire substrate 21 having a (0001) surface as a main surface is first washed with an acid solution. Thereafter, the washed substrate 21 is held by a susceptor within the reactor of a metal organic vapor epitaxy (MOVPE) system (not shown) and the reactor is evacuated. Subsequently, a hydrogen atmosphere having a pressure of 300 Torr is established in the reactor. Then, the temperature within the reactor is raised to about 1100° C. to heat the substrate 21 and thermal cleaning of the surface is carried out for about 10 minutes.

Figure 4A:
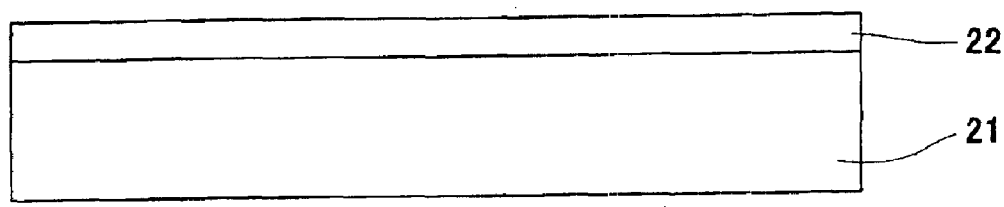
FIGS. 4A to 4C are structural sectional views of a GaN based laser structure selectively grown on a sapphire substrate according to a first embodiment of the invention.

After lowering the temperature of the reactor to about 500° C., 7 sccm trimethyl gallium (TMG), 7.5 slm ammonia (NH$_3$) gas and hydrogen serving as a carrier gas are supplied to the substrate 21 at the same time, thereby growing a low temperature buffer layer comprised of 20 nm thick GaN. Then, the temperature of the reactor is raised to about 1000° C., thereby growing a GaN layer 22 having a thickness of about 1 μm (FIG. 4A).

Figure 4B:
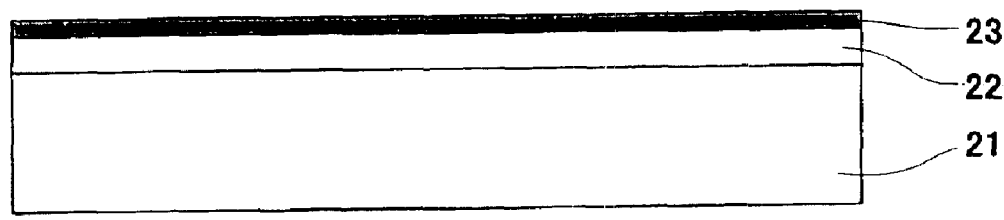
Figure 4C:
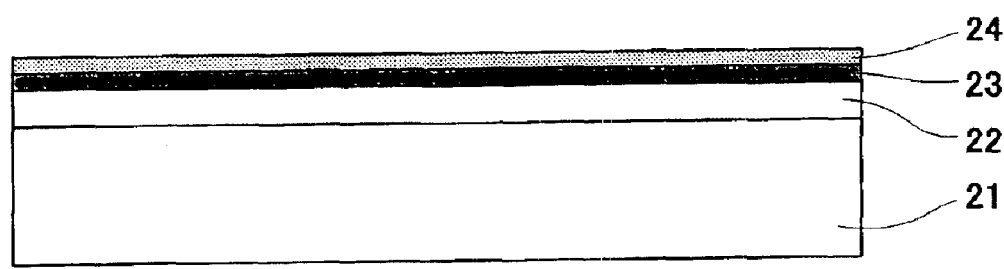

Thereafter, the substrate 21 is taken out of the reactor and an insulating film (masking film) 23 for selective growth is formed on the GaN layer 22. Herein, the insulating film 23 is made from silicon dioxide (SiO$_2$) and deposited so as to have a thickness of about 100 nm, using a plasma CVD system (FIG. 4B). Subsequently, a resist film 24 is applied onto the insulating film 23 (FIG. 4C), and striped resist patterns 24 are formed by photolithography.

Figure 5D:
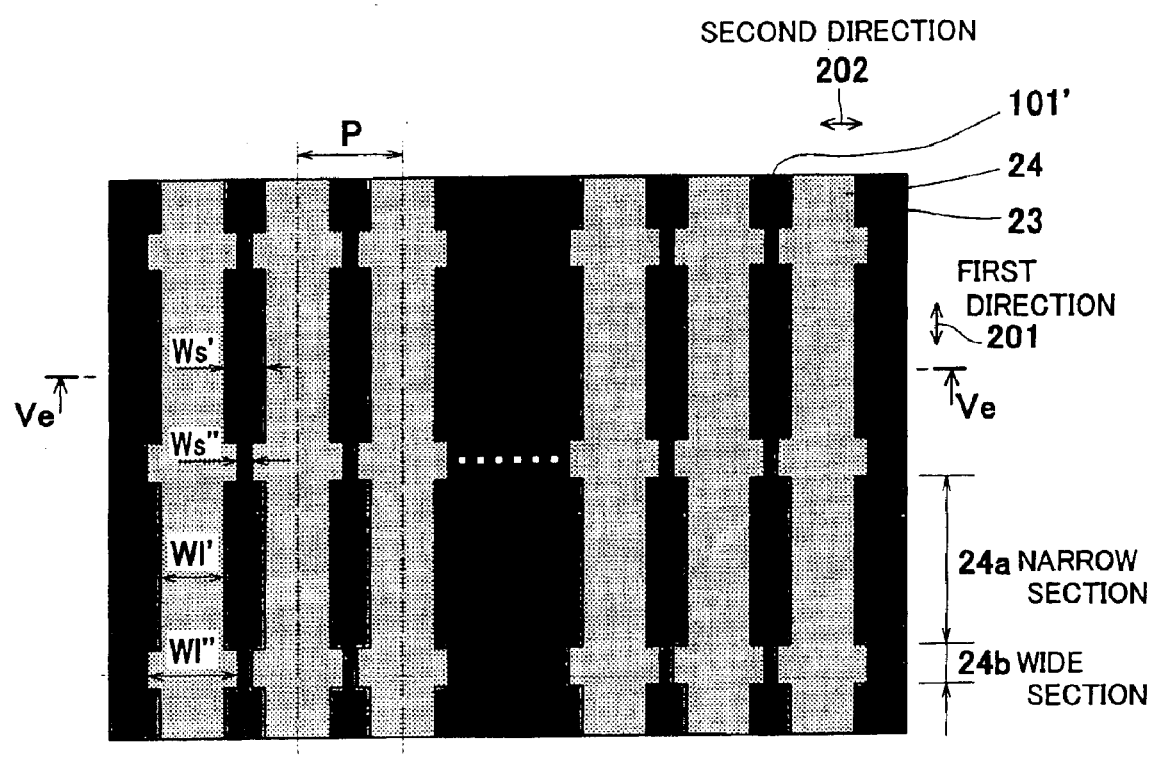
FIGS. 5D to 5F are structural sectional views of the GaN based laser structure selectively grown on the sapphire substrate according to the first embodiment of the invention.
Figure 5E:
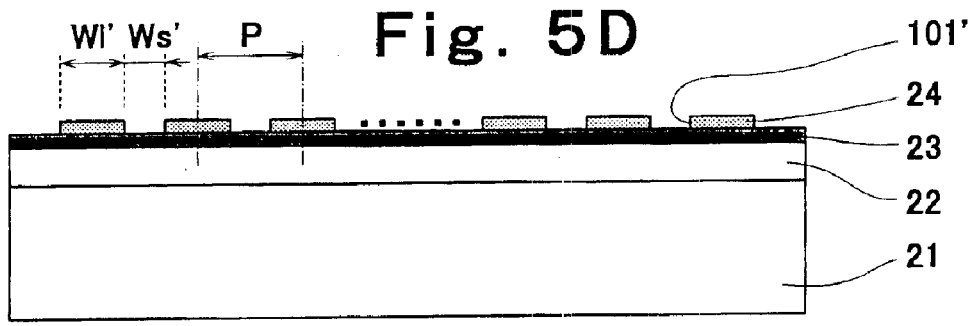

As shown in FIG. 5D, stripe-shaped portions constituting the striped pattern of the resist film 24 are formed in a cycle P of 18 μm. In each stripe-shaped portion, a plurality of narrow sections (first width sections) 24a and a plurality of wide sections (second width sections) 24b are alternately formed in length-wise direction of the stripe-shaped portion. The narrow sections 24a have a length of 700 μm and is formed such that (the width (W1') of the resist film 24:the width (Ws') of the area from which the resist is removed, open area ratio)=(12 μm: 6 μm, 0.33). The wide sections 24b have a length of 50 μm and is formed such that (the width (W1") of the resist film 24:the width (Ws") of the area from which the resist is removed, open area ratio)=(15 μm: 3 μm, 0.17). The wide sections 24b correspond to the area where the window structure for the laser resonator facets (described later) is formed. FIG. 5E shows a sectional view of the narrow sections 24a of a striped pattern (a pattern of the resist film 24). The extending direction of stripe portions which constitute the striped pattern is the same as the <1–100> direction (first direction) 201 of the GaN film. The wide sections 24b are located at the same relative position with respect to a length-wise direction of the resist film 24 and aligned at regular intervals in a direction (second direction) 202 perpendicular to the first direction 201. More specifically, the stripe portions of the resist film 24 are repeatedly formed in a width-wise direction. Herein, the difference in width (d=W1"-W1') between the narrow sections 24a and the wide sections 24b is preferably 16% or more and 84% or less of the width W1' of the narrow sections 24a.

While the cycle P of the stripe portions of the resist film 24 with respect to the widthwise direction shown in FIG. 5 (i.e., the cycle P of the stripe portions of the insulating film 13 with respect to the widthwise direction) is set to 18 μm in the above example, it is preferably within the range of 5 μm or more and 50 μm or less. If the cycle P is less than 5 μm, the difference between the narrow sections 24a and the wide sections 24b is not satisfactory, with the result that the effect of the invention cannot be achieved in some cases. On the other hand, if the cycle P exceeds 50 μm, the area of the insulating film 13 tends to be too small to effectively suppress generation of penetrating dislocation.

Figure 5F:
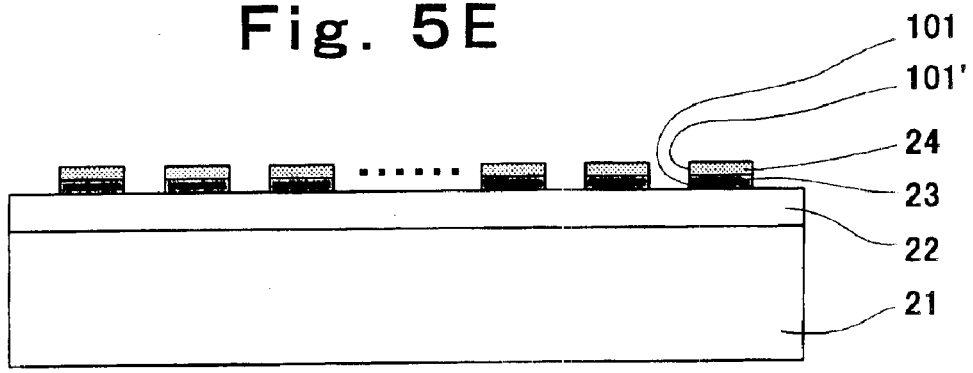
Figure 6G:
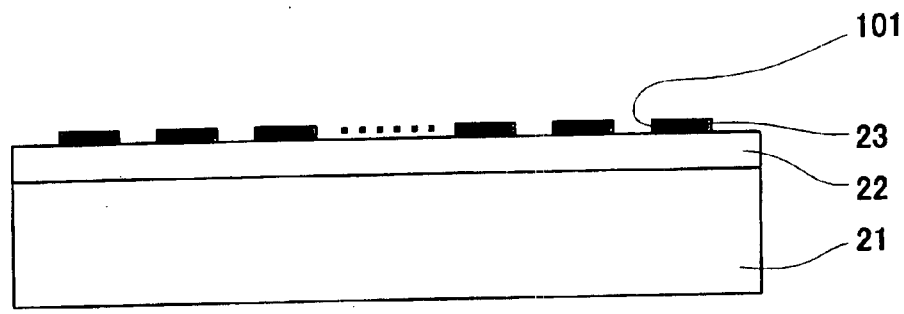
FIGS. 6G to 6H are structural sectional views of the GaN based laser structure selectively grown on the sapphire substrate according to the first embodiment of the invention.
Figure 6H:
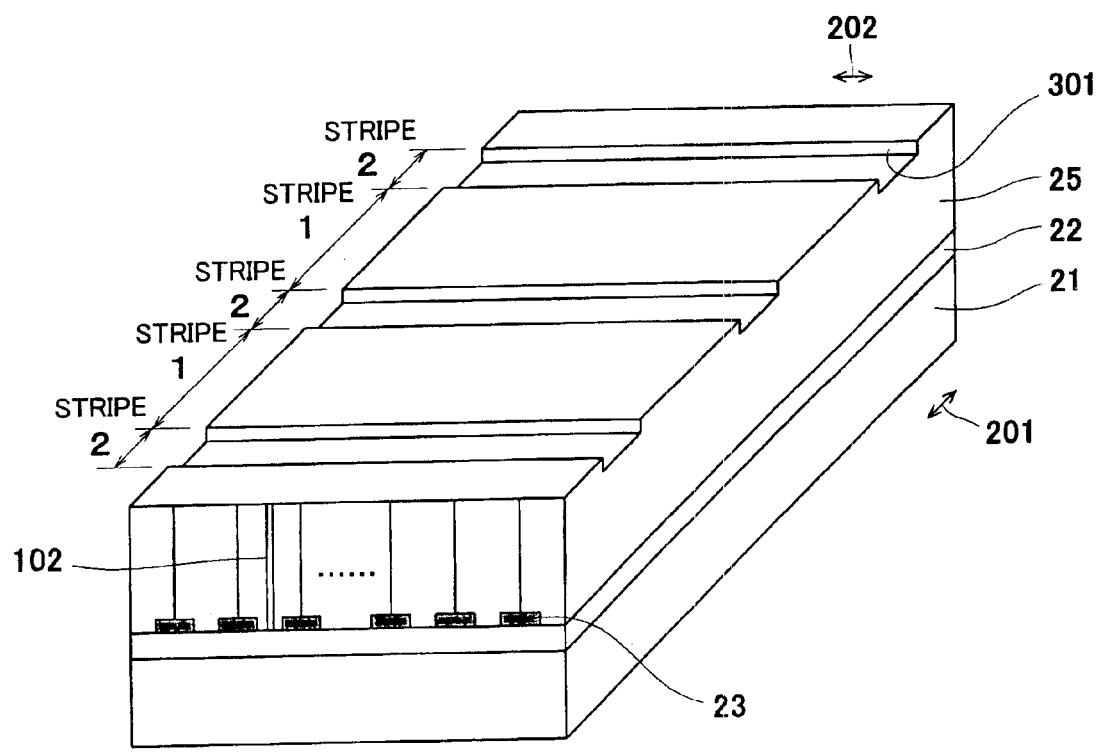

Then, the insulating film 23 at the resist removed portions 101' is removed by a hydrofluoric acid solution, using the resist film 24 as an etching mask so that groove-like openings 101 are formed and the GaN layer 22 is exposed at the bottoms of the openings 101 (FIG. 5F). Subsequently, the resist film 24 is removed by use of an organic solution such as acetone (FIG. 6G). The width of each stripe portion of the insulating film 23, the width of each opening 101 and the open area ratio of the insulating film 23 thus obtained are substantially the same as the width of each stripe portion of the resist film 24, the width of each openings 101' and the open area ratio of the resist film 24, respectively.

Figure 7I:
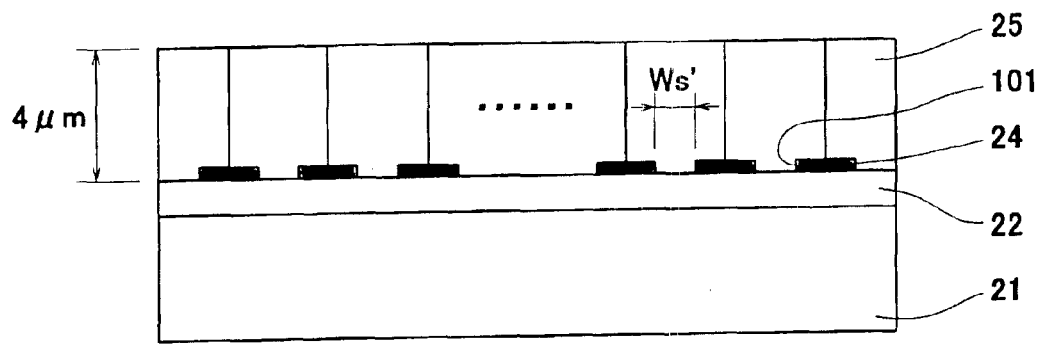
FIGS. 7I to 7K are structural sectional views of the GaN based laser structure selectively grown on the sapphire substrate according to the first embodiment of the invention.
Figure 7J:
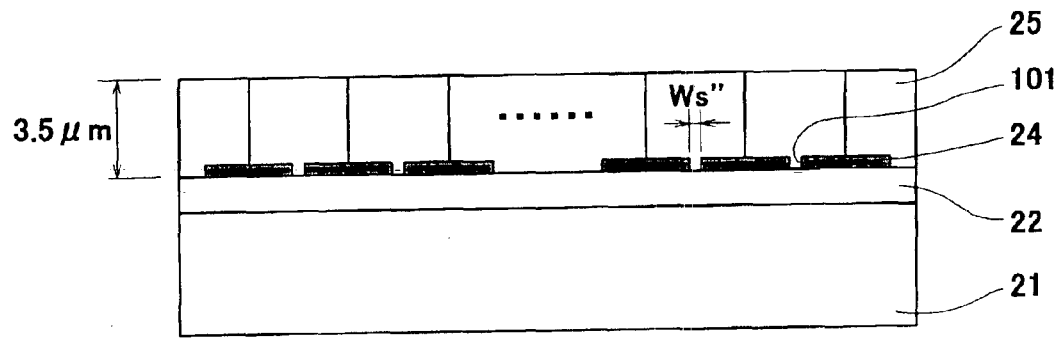

Thereafter, the substrate 21 having the striped insulating film 23 deposited thereon is again held by the susceptor within the reactor of the MOVPE system and the reactor is evacuated in order to selectively grow a GaN layer. Then, a hydrogen atmosphere having a pressure of 200 Torr is established within the reactor and the temperature within the reactor is raised to about 1000° C. 7 sccm trimethyl gallium (TMG), 7.5 slm an ammonia gas (NH$_3$) and hydrogen serving as a carrier gas are supplied at the same time, thereby selectively growing a GaN layer 25 on the selectively grown mask pattern (insulating film 24) shown in FIG. 5D. At that time, the layered film thickness of the GaN layer 25 varies in the first direction 201 (FIG. 6H), since the open area ratio of the insulating film 23 varies in its length-wise direction (first direction) 201. As a result, convex stripes 1 corresponding to the narrow sections of the insulating film 23 and concave stripes 2 corresponding to the wide sections of the insulating film 23 are respectively formed so as to extend in the second direction. In this embodiment, at the time when the GaN layer 25 in the region of the stripes 1 has been selectively grown about 4 µm (FIG. 7I), the film thickness becomes about 3.5 µm in the region of the stripes 2 which have an open area ratio different from that of the stripes 1 (FIG. 7J). This tendency is as shown in FIG. 3. In this embodiment, the open area ratio of the insulating film 13 is varied in a step-like manner in the length-wise direction, but the open area ratio may be varied in a gradually inclined manner. With such variation, the film thickness of the GaN layer 25 can be gradually varied, thereby restraining generation of defects such as dislocation.

Figure 7K:
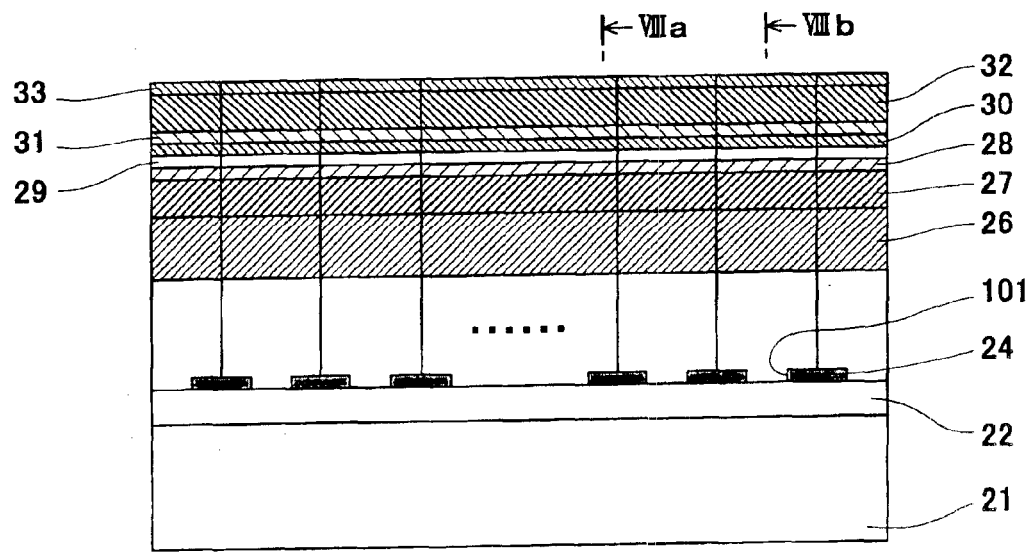
Figure 8A:
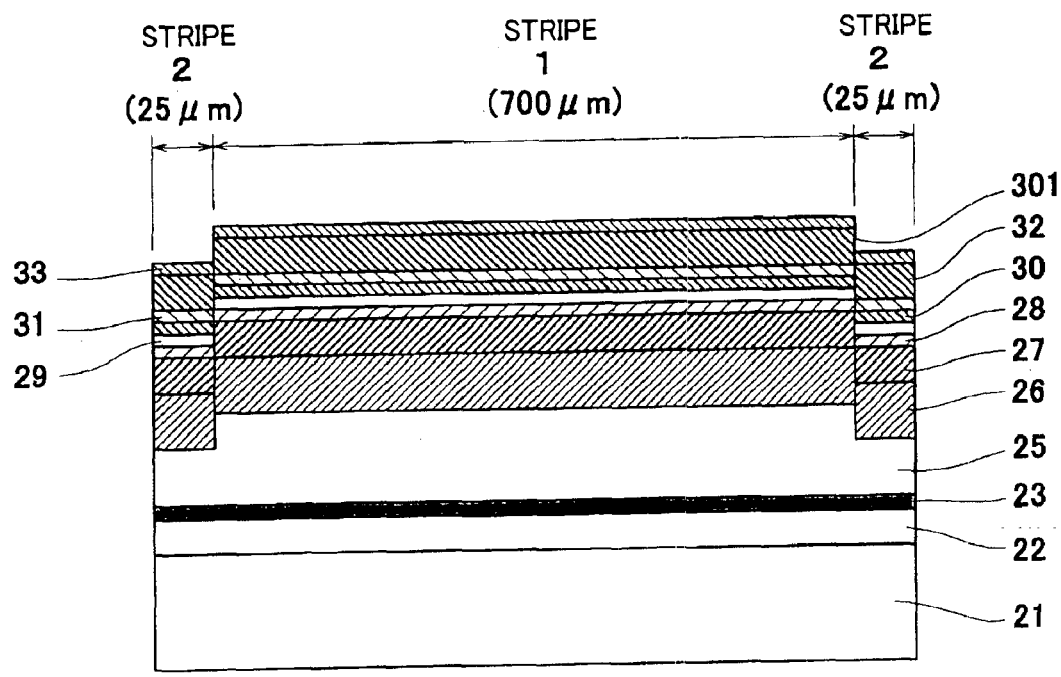
Figure 8B:
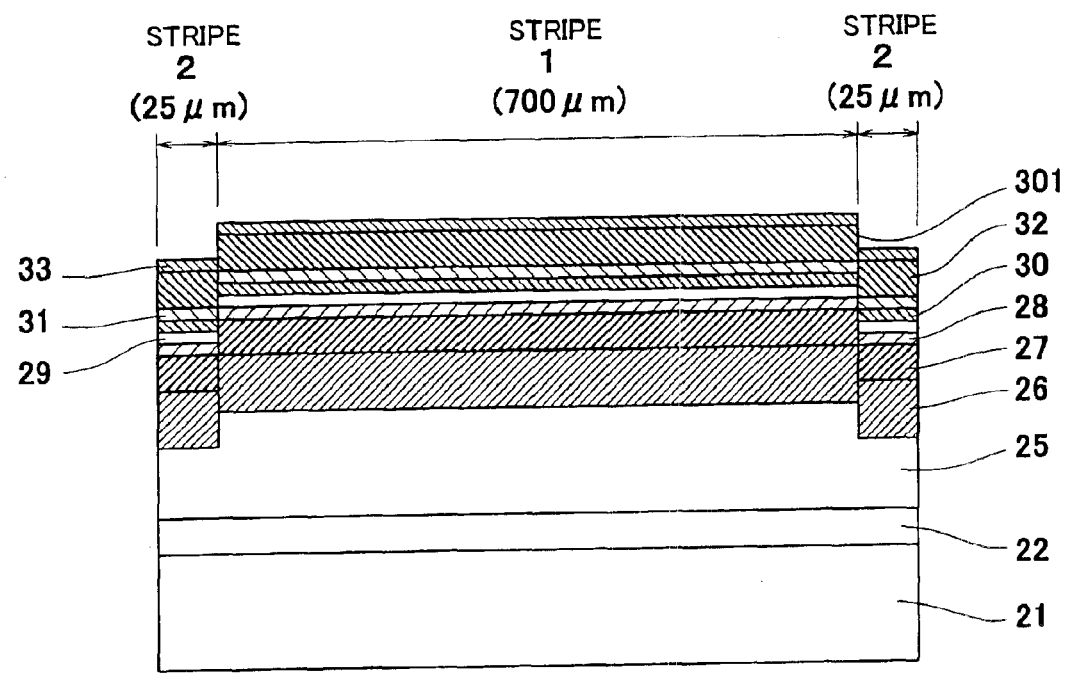

Subsequently, silane ($SiH_4$) gas is supplied as an n-type dopant, thereby growing an about 2 µm thick n-type contact layer 26 comprised of n-type GaN having an Si impurity concentration of about 1E18 $cm^{-3}$. Then, while supplying trimethyl aluminum (TMA), an about 0.7 µm thick n-type cladding layer 27 comprised of n-type $Al_{0.07}Ga_{0.93}N$ having an Si impurity concentration of 5E17 $cm^{-3}$ is grown. After growing an about 120 nm thick first optical guide layer 28 comprised of n-type GaN having an Si impurity concentration of 1E18 $cm^{-3}$, temperature is lowered to about 800° C., the carrier gas is changed from hydrogen to nitrogen, and trimethyl indium (TMI) and TMG are supplied, thereby growing a multiple quantum well active layer 29 composed of about 3 nm thick quantum well layers (three layers) comprising $In_{0.1}Ga_{0.9}N$ and about 9 nm thick GaN barrier layers (two layers). Thereafter, the temperature in the reactor is again raised to about 1000° C., the carrier gas is changed from nitrogen to hydrogen, and while supplying bis cyclopentadienyl magnesium ($Cp_2Mg$) gas serving as a p-type dopant, an about 20 nm thick cap layer 30 comprised of $Al_{0.15}Ga_{0.85}N$ having an Mg impurity concentration of 5E17 $cm^{-3}$ is grown. Then, an about 120 nm thick second optical guide layer 31 comprised of a p-type GaN having an Mg impurity concentration of 1E18 $cm^{-3}$ is grown. Subsequently, an about 0.7 µm thick p-type cladding layer 32 comprised of p-type $Al_{0.07}Ga_{0.93}N$ having an Mg impurity concentration of 5E17 $cm^{-3}$ is grown. Lastly, an about 0.1 µm thick p-type contact layer 33 comprised of p-type GaN having an Mg impurity concentration of 1E18 $cm^{-3}$ is grown (FIG. 7K). After completion of the crystal growth, the thickness of the layered films of the laser structure was measured with a section SEM and it was found that the thickness of the stripe region 1 was about 0.5 µm thicker than the stripe region 2, as shown in FIGS. 8A and 8B. Specifically, there exists a layered film level difference 301 (step) between the stripe region 1 and the stripe region 2. This is attributable to the difference in film thickness in the GaN layer 25. The level difference portion 301 extends in the width-wise direction (in the lateral direction in FIG. 6H) as indicated by "the stripe 2" in FIG. 6H. Namely, the extending direction of the level difference portion 301 is orthogonal to the length-wise direction of stripe of the insulating film 13 (see FIG. 5D. the vertical direction in FIG. 5D).

It has been found that owing to the difference in film thickness, the active layer 29 of the stripe region 1 is located within the region where the p-type $Al_{0.07}Ga_{0.93}N$ cladding layer 32 of the stripe region 2 is positioned, in the thickness-wise direction of the layered films. Therefore, in the stripe region 2 which corresponds to the facet window structure region, laser light generated in the active layer 29 of the stripe region 1 is propagated within the $Al_{0.07}Ga_{0.93}N$ cladding layer 32 having a greater bandgap energy than the active layer 29. As a result, the amount of absorbed laser light in the facet region is reduced.

After the growth, an activation heating process for the p-type semiconductor layer is first carried out. The substrate is taken out of the reactor of the MOVPE system and conveyed into an anealing furnace to perform a heating process for activation of p-type impurities. After the anealing furnace has been evacuated, 3 slm nitrogen gas is introduced to produce atmospheric pressure and then, heating is carried out at 750° C. for 20 minutes. After completion of the heating process, the temperature of the substrate is lowered to room temperature and the substrate is then taken out of the anealing furnace.

Figure 9:
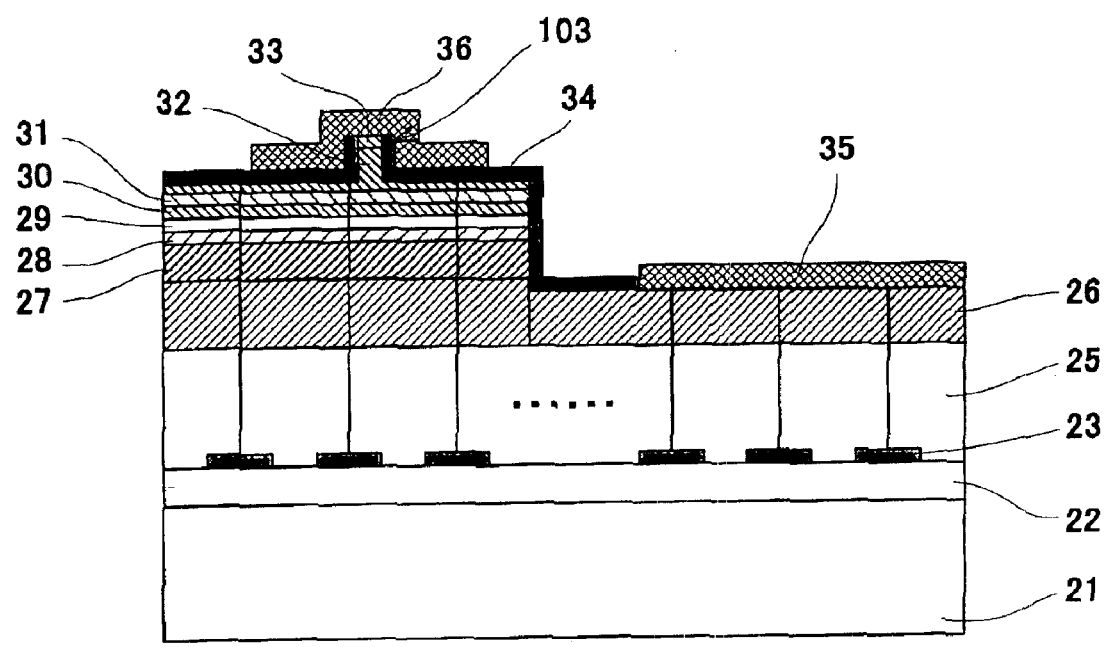
FIG. 9 is a structural sectional view of the selectively grown GaN based laser according to the first embodiment of the invention.

With reference to FIG. 9 which shows a structural sectional view of a laser structure, a process of fabricating the laser structure will be described below.

After completion of the heating process, an insulating film comprised of $SiO_2$ is deposited on the surface of the substrate 21. Then, a resist film is deposited on the insulating film and subjected to photolithography so that the resist film is left only at a ridge formation position (the width of the ridge is about 2 µm) of the p-type contact layer 33. At that time, by carrying out ridge formation in the selective growth region (low dislocation density region) on the insulating film 23, operating current for the laser device can be reduced and the durability of the laser device can be increased. Thereafter, the insulating film in the resist removed portion is removed by a hydrofluoric acid solution, using the resist film as an etching mask to expose the p-type contact layer 33. Subsequently, other regions than the ridge formation position are etched by use of a dry etching system to make the remaining film thickness of the p-type layer on the active layer 29 be about 50 nm. Then, the resist film is removed using an organic solution such as acetone. In this way, a ridge 103 constituted by the p-type contact layer 33 and the $Al_{0.07}Ga_{0.93}N$ cladding layer 32 is formed. The extending direction of the ridge 103 is parallel with the length-wise direction of stripe and, namely, the same as the first direction 201.

Other regions than the n-type electrode formation position are covered with the insulating film composed of $SiO_2$ and dry etching is performed to expose the n-type contact layer 26. The electric separation between the p-side and the n-side is made by an insulating film 34 composed of $SiO_2$ and the insulating film 34 on the p-type contact layer 33 positioned on the ridge 103 is removed using a hydrofluoric acid solution. Thereafter, Ti/Al and Ni/Pt/Au are formed as an n-side electrode 35 and a p-side electrode 36, respectively, on the parts from which the insulating film 34 has been removed.

Subsequently, cleavage of the laser resonator facets is performed. First, the substrate 21 is ground from the rear face of the sapphire substrate so that the total film thickness becomes about 120 µm. Then, the substrate 21 is cleaved by a cleaving apparatus (not shown) so that the resonator facets are oriented in the <1–100> direction of the sapphire substrate (the cleaved face is the (11–20) face). By cleaving the center of the stripe (facet window structure) region 2 at that time, a laser device A (resonator length=750 µm) in the form of a bar having the facet window structure region (length=25 µm) at both ends can be produced.

Next, the rear end face of the laser resonator is coated with a highly reflective film through the following procedure. The highly reflective film has a dielectric multilayer film structure composed of three pairs of $SiO_2$ and titanium dioxide ($TiO_2$).

A silicon bar shorter than the length (750 µm) of the laser resonator is inserted between the laser devices A in the form of a bar and secured to a jig. The silicon bar is designed to be shorter than the resonator length in order to avoid such an undesirable situation in which the laser facets cannot be coated with the dielectric film as planned, because the silicon bar acts as an obstacle during sputtering. Then, the dielectric film is sputtered to the entire surface of the jig to which the laser devices A are secured, thereby carrying out facet coating. The height of the silicon bar used herein is 735 µm. Therefore, at the rear facet of the laser device A, the dielectric multilayer film is adhered to both the electrode side and substrate side of the laser device A within the regions within 15 µm from the respective facets in direction of the resonator (within the facet window structure region).

Figure 10:
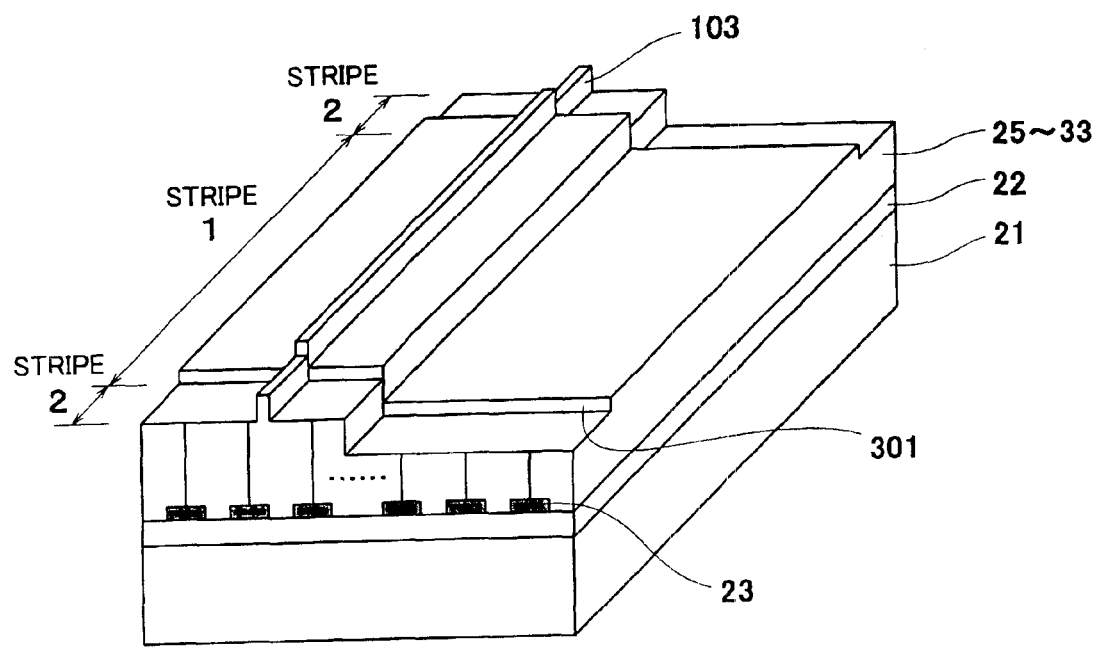
FIG. 10 is a perspective view showing a structure of a selectively grown GaN based laser having a facet window structure according to the first embodiment of the invention, from which electrodes and an insulating film are removed.
Figure 14:
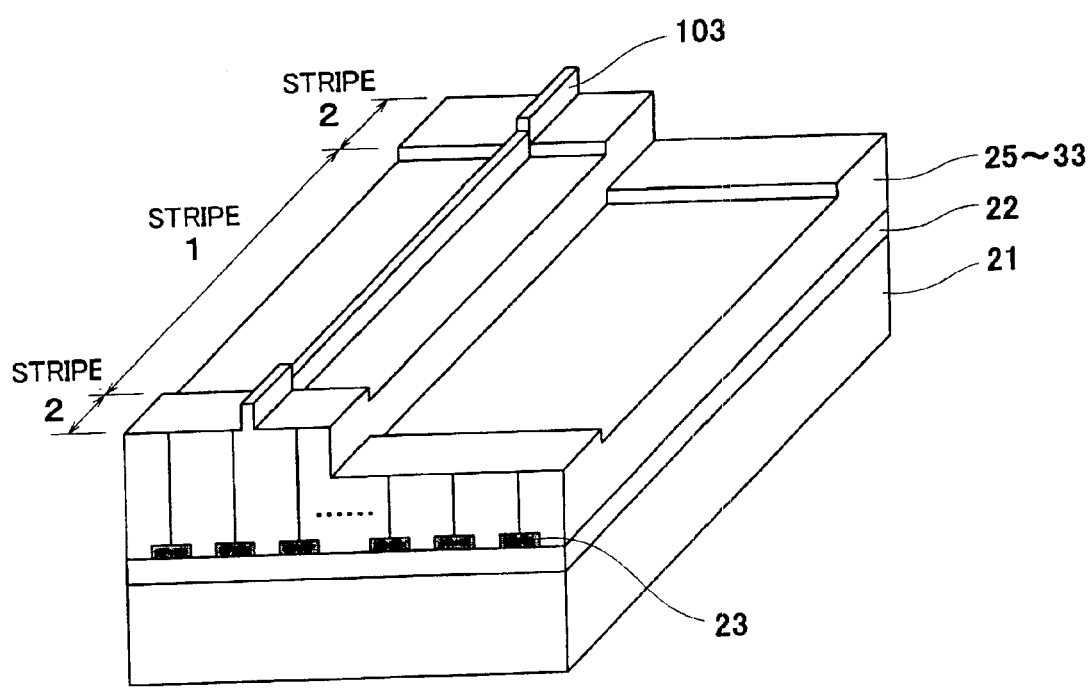
FIG. 14 is a perspective view showing a structure of a selectively grown GaN based laser having a facet window structure according to a second comparative example for the first embodiment of the invention, from which electrodes and an insulating film are removed.

Lastly, secondary cleavage of the laser device A in the form of a bar is carried out so that the laser device A is divided into laser chips to be mounted p-side down into a laser can. In the mounting, the laser chips are mounted on a sub-mount made from silicon carbide (SiC) by means of solder. The outputting facet is a little distance (about 10 µm) separated from the sub-mount forwardly for fear that the solder might be adhered to the outputting facet. FIG. 10 illustrates an outer appearance of a laser chip from which the insulating film 34, the n-side electrode 35 and the p-side electrode 36 are eliminated with the intention of clearly illustrating the irregularity of the laser surface (FIGS. 11 and 14 are drawn in the same manner).

FIRST COMPARATIVE EXAMPLE

Figure 11:
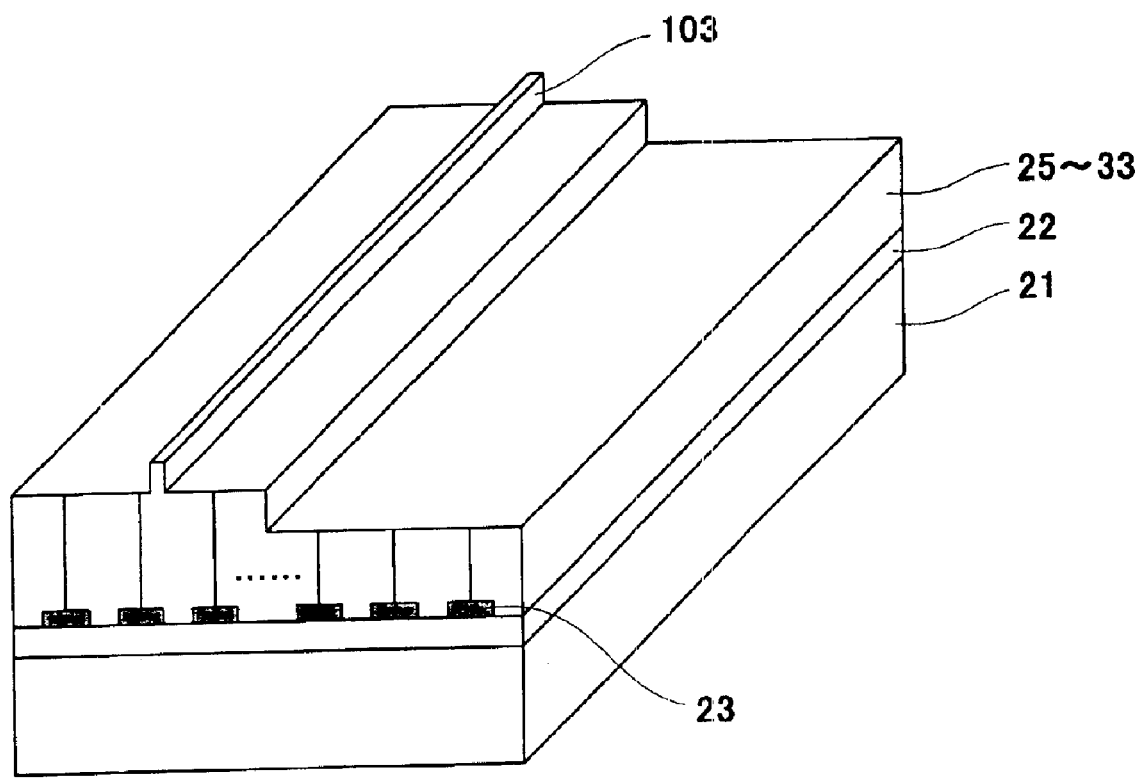
FIG. 11 is a perspective view showing a structure of a selectively grown GaN based laser according to a first comparative example for the first embodiment of the invention, which does not have the facet window structure and from which electrodes and an insulating film are removed.

As a first comparative example, a laser device B, which did not have the stripe (facet window structure) region 2 but comprised only a region corresponding to the stripe region 1, was prepared (FIG. 11).

The first embodiment has the following distinctive laser device properties.

Figure 12:
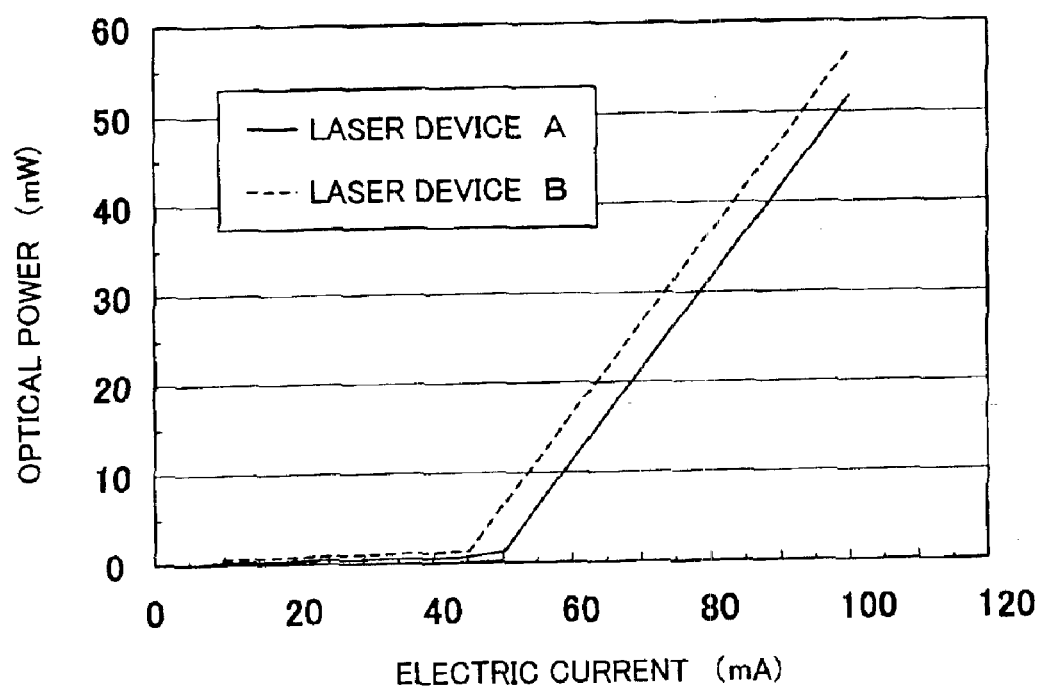
FIG. 12 is a graph showing the current verses optical power properties of the selectively grown GaN based lasers (laser devices A, B) according to the first embodiment of the invention.
Figure 13:
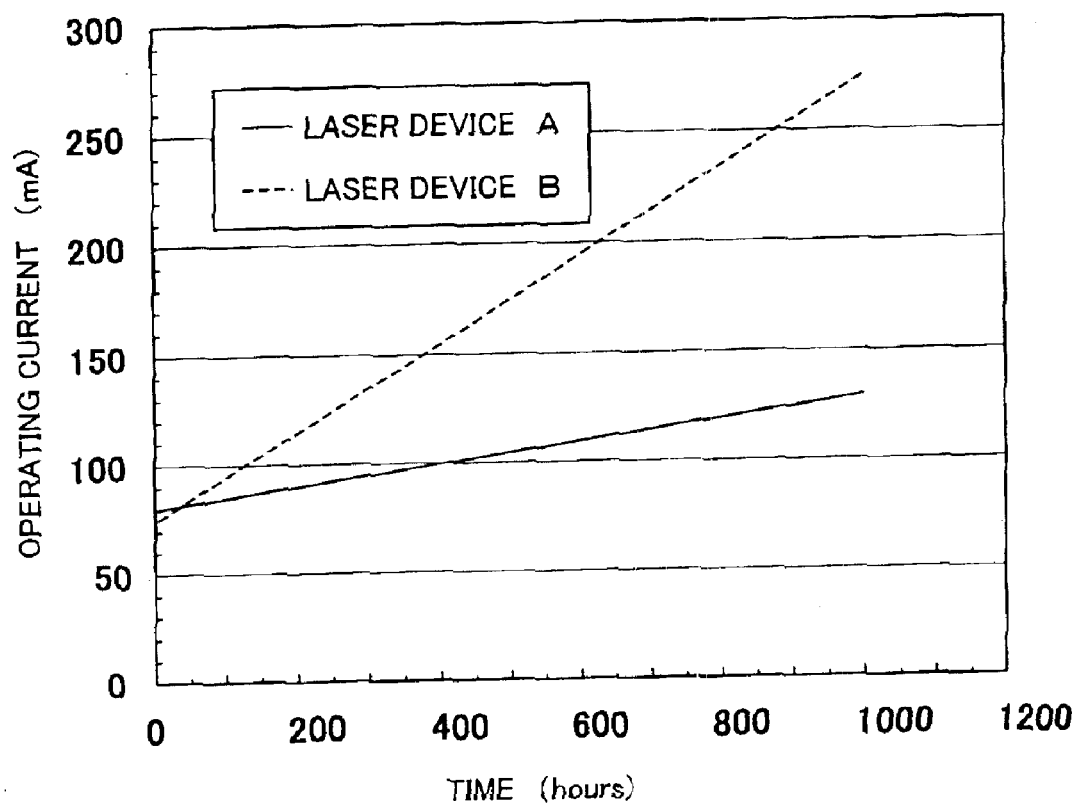
FIG. 13 is a graph showing a result of a life test which is conducted on the selectively grown GaN based lasers (the laser devices A, B) of the first embodiment of the invention at room temperature with an optical power of 30 mW being constantly output.

In the laser device A fabricated according to the first embodiment, gain was obtained within the stripe region 1 by current injection, resulting in continuous oscillation at room temperature. At that time, the threshold current and slope efficiency were 50 mA and 1.0 W/A, respectively (FIG. 12). On the other hand, the threshold current and slope efficiency of the laser device B prepared for comparison were 45 mA and 1.0 W/A, respectively (FIG. 12). The threshold current of the laser device A increased on the ground that since the laser device A had a facet window structure region (length= 25 µm) at both facets, a reactive current which did not contribute to laser oscillation flew in this region. Next, a life test was conducted on the laser devices A and B at room temperature with an optical power of 30 mW being constantly output (FIG. 13). The deterioration rate of the laser device B was about 0.2 mA/h, whereas the laser device A had a deterioration rate of about 0.05 mA/h and demonstrated operational stability for 1000 hours (no more than twice the operating current). After the life test, the electroluminescence (EL) image of each laser device was observed from the rear face of the sapphire substrate (not shown). In the laser device A, light was uniformly emitted along the ridge 103 throughout the entire length of the resonator. On the other hand, in the laser device B, light emission was weak at both facets and weak light emission was significant particularly at the outputting facet. The reason for this is that since the laser device B does not have a facet window structure region, non-radiative recombination proceeds at the surface level of the facets so that the amount of heat generation in the neighborhood of the facets increases and a sort of COD seems to have occurred. In addition, it is contemplated that since p-side down packaging is done with a space kept between the outputting facet and the solder such that the solder should not adhere to the outputting facet, heat dissipation deteriorates and therefore COD is likely to occur in the laser device B. In GaN based semiconductor lasers, operating voltage is high because of their material so that power consumption inevitably increases. Therefore, it has phenomenally found that heat dissipation (particularly caused in the neighborhood of the facets) which has not been regarded as a problem for semiconductor lasers other than the conventional GaN based lasers becomes an important factor. It is understood from the foregoing fact that, since it is possible for the laser device of the invention to simultaneously form the low dislocation density structure and the facet window structure through one selective growth process which are essential for obtaining long service life in high optical power operation, the fabrication process for the laser device can be facilitated and improved yields as well as cost reduction can be achieved. It should be noted that since the laser device A has the facet window structure, the laser device A is unlikely to be adversely affected by a returning light generated at the time of reproduction of data from an optical disk and noise reduction is possible over the range of law optical power (2 to 3 mW) to high optical power (30 mW).

SECOND COMPARATIVE EXAMPLE

For comparison between the laser device A and a second comparative example, the following test was made.

As the second comparative example, a laser device C was prepared in which the open area ratio was made to be high and the layered film thickness was increased at the laser resonator facets (FIG. 14).

The procedure for fabricating the laser device C is the same as that of the laser device A except the open area ratio of the stripes 2 formed by crystal growth. Herein, the stripes 2 of the laser device C are formed such that (the width of the resist film 24: the width of the area from which the resist is removed, open area ratio)=(9 µm: 9 µm, 0.5). Since the stripes 1 are formed such that (the width of the resist film 24: the width of the area from which the resist is removed, open area ratio)=(12 µm: 6 µm, 0.33), the open area ratio of the insulating film increases at the laser resonator facets. After the crystal growth, the entire thickness of the layered films of the laser structure was measured using a section SEM, and it was found that the thickness of the stripe region 2 was about 6.5 µm whereas the thickness of the stripe region 1 was about 6 µm and thus, the layered film thickness increased at the resonator facets. This tendency appears as shown in FIG. 3.

The threshold current and slope efficiency of the laser device C were found to be 60 mA and 0.6 W/A, respectively. Then, a life test was conducted on a laser device C at room temperature with an optical power of 30 mW being constantly output, and it was found that the laser device C rapidly deteriorated with the operating current becoming 300 mA after about 10 hours. Then, the laser device C was dismounted from the sub-mount and the condition of the solder on the surface of the laser device was observed by use of a SEM (not shown). It was found that the solder did not adhere to other regions than the facet window structure (stripes 2) and the deterioration of heat dissipation seems to have adversely affected the service life of the laser device. This imperfect adhesion of the solder is attributable to the fact that since the thickness of the layered films increases in the stripe region 2, the solder preferentially adheres to the stripe region 2.

It is understood from the above discussion that when the facet window structure is formed, the thickness of the layered film in this region should be equal to or less than the thickness of other regions than the facet window structure region.

Second Embodiment

The second embodiment of the invention is associated with a method for fabricating a GaN based semiconductor laser, wherein both the low dislocation density structure and the facet window structure useful for suppression of COD generation at the laser resonator facets are achieved with high yields at low cost by carrying out selective growth, in the crystal growth of a semiconductor laser, through the above layered film thickness control method using an insulating film having different open area ratios.

The method for fabricating GaN based laser of the second embodiment of the invention will be hereinafter described.

Figure 15:
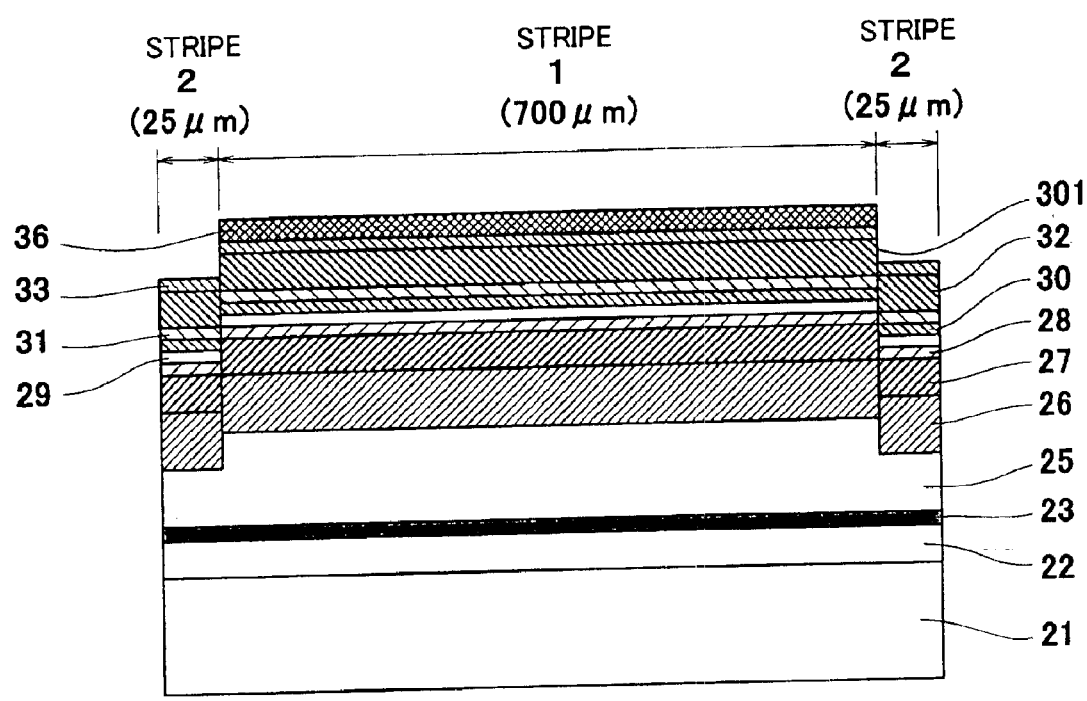
FIG. 15 is a structural sectional view of a selective grown GaN based laser having the facet window structure and a facet current non-injection structure according to a second embodiment of the invention.

The procedure from the crystal growth to the formation of the electrodes is similar to that of the first embodiment. However, it should be noted that another step is included in the second embodiment, in which the p-side electrode is removed by wet etching from the region corresponding to the stripe (facet window structure) region 2 of the first embodiment. The procedures for cleavage, facet coating and packaging of the second embodiment are the same as those of the first embodiment. A laser device D thus prepared does not have a p-side electrode in the facet window structure region and therefore has the facet current non-injection structure. FIG. 15 shows a structural sectional view of a part of the laser device D under a ridge.

The second embodiment has the following distinctive laser device properties.

Figure 16:
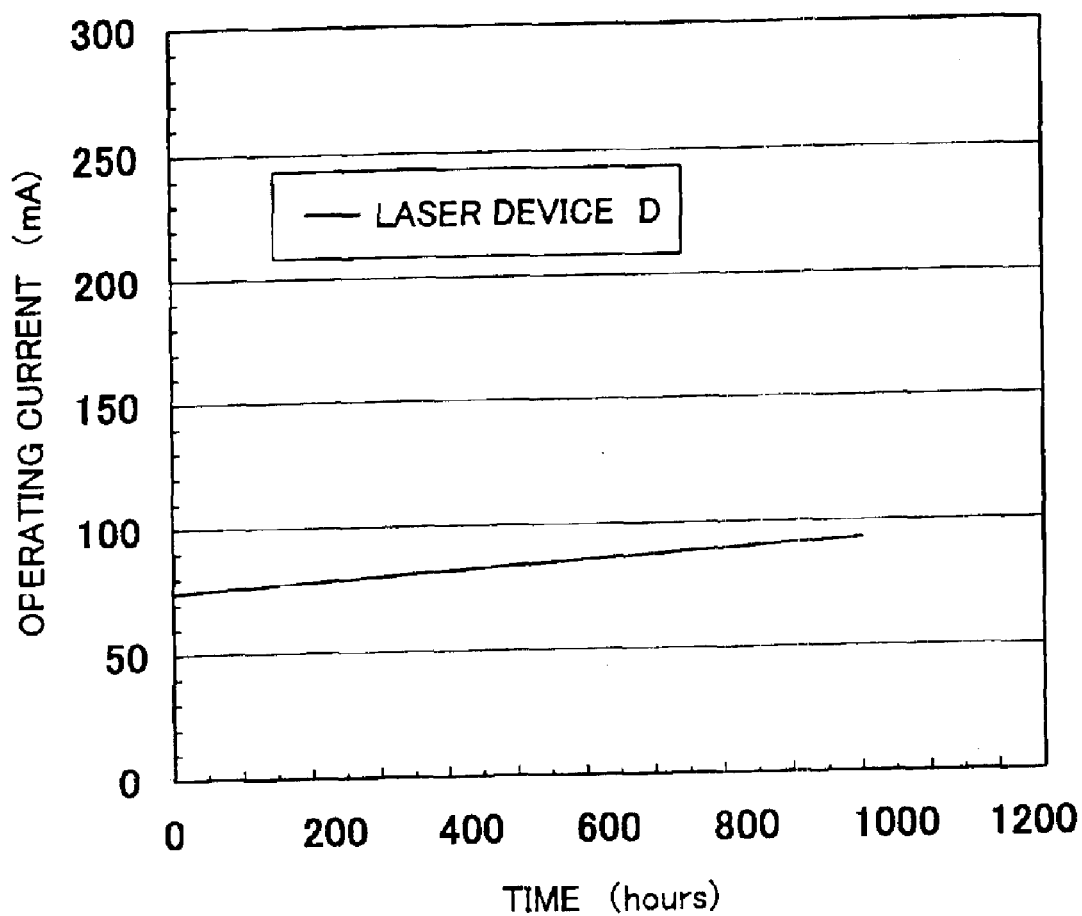
FIG. 16 is a graph showing a result of a life test which is conducted on a selectively grown GaN based laser (a laser device D) according to the second embodiment of the invention at room temperature with an optical power of 30 mW being constantly output.

In the laser device D fabricated according to the second embodiment, gain was obtained within other regions than the facet window structure region by current injection, resulting in continuous oscillation at room temperature. At that time, the threshold current and slope efficiency were 45 mA and 1.0 W/A, respectively (FIG. 12). The reason why the laser device D had a threshold current lower than that (50 mA) of the laser device A of the first embodiment is that the facet window structure region has the current non-injection structure so that a reactive current, which does not contribute to laser oscillation in this region and is a problem of the laser device A, is suppressed. Next, a life test was conducted on the laser device D at room temperature with an optical power of 30 mW being output (FIG. 16). The deterioration rate of the laser device D was about 0.02 mA/h and the laser device D demonstrated operational stability for 1000 hours (no more than twice the operating current). After the life test, the EL image of the laser device was observed from the rear face of the sapphire substrate (not shown). In the laser device D, light was uniformly emitted along the ridges throughout the entire length of the resonator even after the life test and occurrence of COD was not observed. It was found from the above facts that a laser device having the facet window structure and the facet current non-injection structure has much higher reliability in high optical output power operation and contributes to achievement of high yields and cost reduction. It should be noted that since the laser device D has the facet window structure, the laser device D is unlikely to be adversely affected by a returning light generated at the time of reproduction of data from an optical disk and noise reduction is possible over the range of law optical power (2 to 3 mW) to high optical power (30 mW).

Third Embodiment

The third embodiment of the invention is associated with a method for fabricating a GaN based semiconductor laser, wherein both the low dislocation density structure and the facet window structure useful for suppression of COD generation at the laser resonator facets are achieved with high yields at low cost by carrying out selective growth, in the crystal growth of a semiconductor laser, through the above layered film thickness control method using an insulating film having different open area ratios.

The method for fabricating GaN based laser of the third embodiment of the invention will be hereinafter described.

Figure 17:
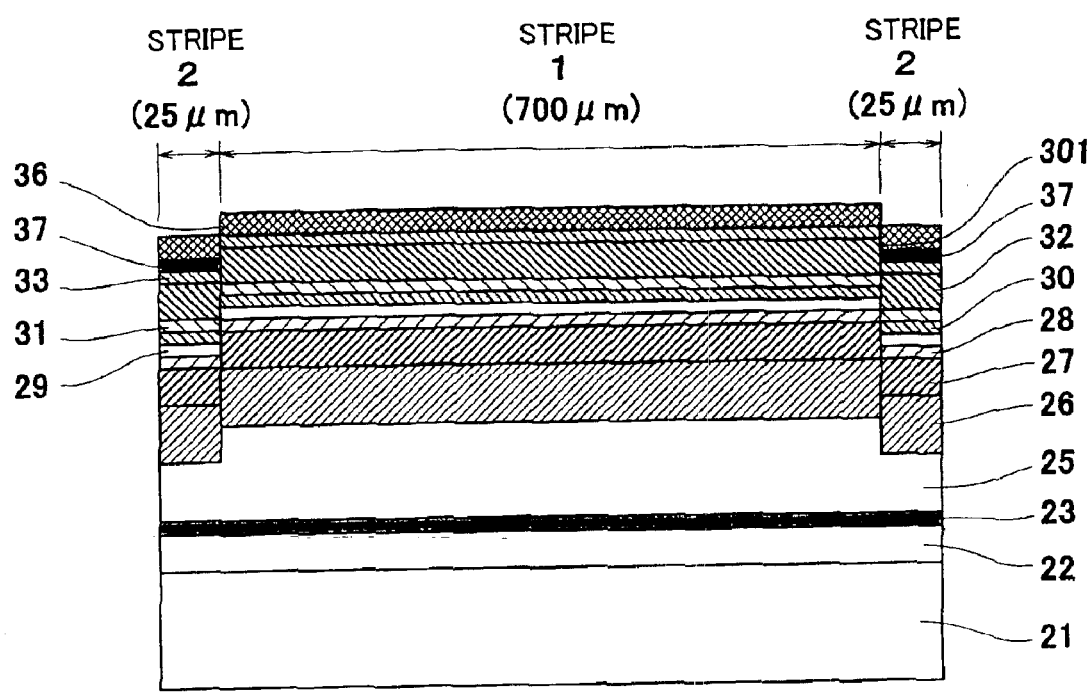
FIG. 17 is a structural sectional view showing a structure of a selectively grown GaN based laser having the facet window structure and the facet current non-injection structure according to a third embodiment of the invention in a longitudinal direction of a resonator.

The procedure for the crystal growth etc. is nearly the same as that of the first embodiment. It should, however, be noted that another step is included in the third embodiment, in which an insulating film 37 composed of $SiO_2$ is formed under the p-side electrode at the position corresponding to the stripe (facet window structure) region 2 of the first embodiment. The procedures for electrode formation, cleavage, facet coating and packaging of the third embodiment are the same as those of the first embodiment. A laser device E thus prepared has an insulating film under the p-side electrode in the facet window structure region and therefore has the facet current non-injection structure. FIG. 17 shows a structural sectional view of a part of the laser device E under a ridge.

The third embodiment has the following distinctive laser device properties.

In the laser device E fabricated according to the third embodiment, gain was obtained within other regions than the facet window structure region by current injection, resulting in continuous oscillation at room temperature. At that time, the threshold current and slope efficiency were 45 mA and 1.0 W/A, respectively. The reason why the laser device E has a threshold current lower than that (50 mA) of the laser device A of the first embodiment is that the facet window structure region has the current non-injection structure so that a reactive current, which does not contribute to laser oscillation in this region and is a problem of the laser device A, is suppressed. Next, a life test was conducted on the laser device E at room temperature with an optical power of 30 mW being constantly output. The deterioration rate of the laser device E was about 0.02 mA/h like the laser device D and the laser device E demonstrated operational stability for 1000 hours. After the life test, the EL image of the laser device E was observed from the rear face of the sapphire substrate (not shown). In the laser device E, light was uniformly emitted along the ridges throughout the entire length of the resonator even after the life test and occurrence of COD was not observed. It was found from the above facts that a laser device having the facet window structure and the facet current non-injection structure has much higher reliability in high optical output power operation and contributes to achievement of high yields and cost reduction. It should be noted that since the laser device E has the facet window structure, the laser device E is unlikely to be adversely affected by a returning light generated at the time of reproduction of data from an optical disk and noise reduction is possible over the range of law optical power (2 to 3 mW) to high optical power (30 mW).

THIRD COMPARATIVE EXAMPLE

For comparison with the laser device E, the following test was made.

As a third comparative example, a laser device F was prepared by applying the facet current non-injection structure of the third embodiment to the laser device B (having no facet window structure region) of the first embodiment.

Figure 18:
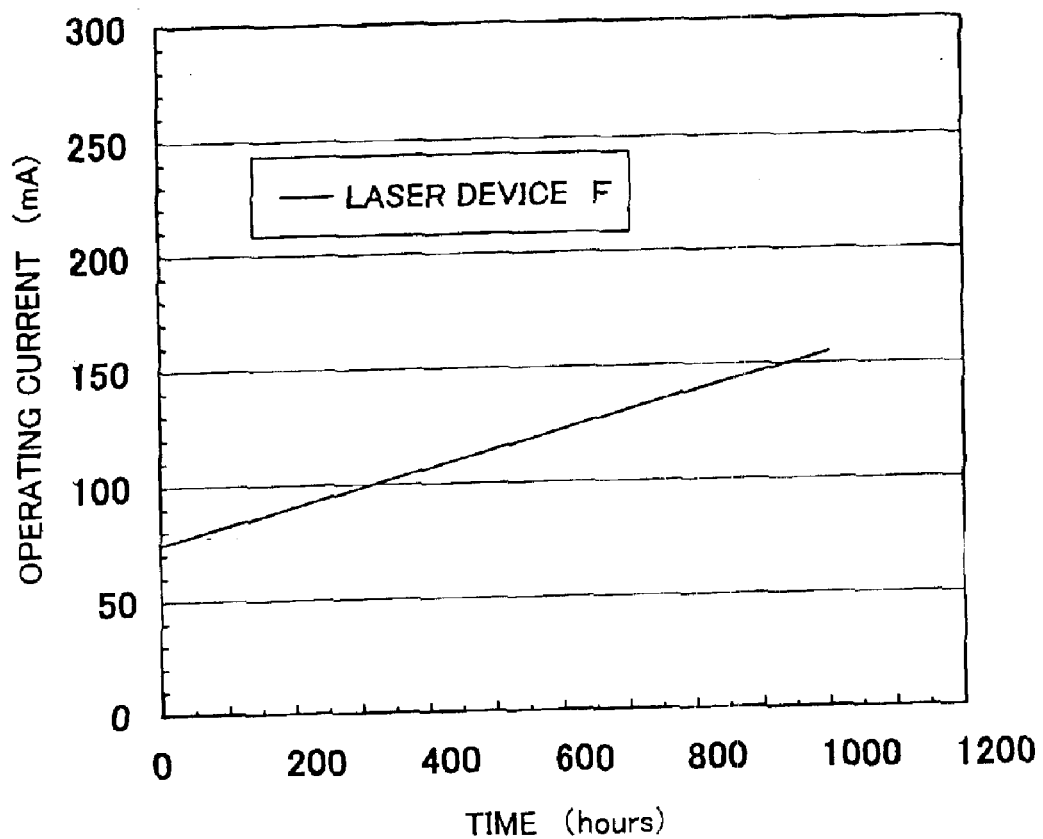
FIG. 18 is a graph showing a result of a life test which is conducted on a selectively grown GaN based laser (a laser device F) of the third embodiment of the invention at room temperature with an optical power of 30 mW being constantly output.

The threshold current and slope efficiency of the laser device F were 45 mA and 1.0 W/A respectively and the laser device F had current-optical output properties equivalent to those of the laser devices D and E. Next, a life test was conducted on the laser device F at room temperature with an optical power of 30 mW being constantly output (FIG. 18). The deterioration rate of the laser device F was found to be about 0.08 mA/h. This is superior to the deterioration rate (0.2 mA/h) of the laser device B but inferior to the deterioration rate (0.05 mA/h) of the laser device A. After the life test, the EL image of the laser device F was observed from the rear face of the sapphire substrate (not shown). In the laser device E, almost uniform light was emitted along the ridges throughout the entire length of the resonator even after the life test and occurrence of noticeable COD was not observed.

It was understood from the above facts that when a laser device does not have the facet window structure, heat generation in the neighborhood of the facets can be restrained by employing the facet current non-injection structure and therefore the facet current non-injection structure is effective for increasing the service life of a laser device but cannot increase it to the same level as those of the laser devices A, D and E. It is believed that, in the laser devices A, D and E, laser light absorption at the facets can be restrained by employing the facet window structure in addition to the facet current non-injection structure and heat generation at the facets can be restrained by just that much so that improved service life can be achieved.

Fourth Embodiment

The fourth embodiment of the invention is associated with a method for fabricating a GaN based semiconductor laser, wherein both the low dislocation density structure and the facet window structure useful for suppression of COD generation at the laser resonator facets are achieved with high yields at low cost by carrying out selective growth, in the crystal growth of a semiconductor laser, through the above layered film thickness control method using an insulating film having different open area ratios.

The method for fabricating GaN based laser of the fourth embodiment of the invention will be hereinafter described.

The procedure for crystal growth of the fourth embodiment is nearly the same as that of the first embodiment. It should, however, be noted that in the fourth embodiment, the length of the stripe (facet window structure) region 2 described in the first embodiment is varied in the direction of the resonator and the facet current non-injection structure described in the third embodiment is employed. The procedures for cleavage, facet coating and packaging of the fourth embodiment are the same as those of the first embodiment. Under these conditions, a group of laser devices 7 (not shown, the length of the resonator: 750 $\mu$m) was prepared, each device having, at both ends, the facet window structure (length: 15, 25, 35, 50, 75 $\mu$m). Herein, the laser device having at both ends the facet window structure region (length: 25 $\mu$m) is the laser device E described earlier. Where the facet window structure occupancy rate with respect to the length of the resonator is defined as (the facet window structure region)/(the length of the resonator), the occupancy rates of the laser devices having, at both ends, the facet window structure (length: 15, 25, 38, 55, 75 $\mu$m) are 4, 7, 10, 15 and 20%, respectively.

The properties of laser devices G fabricated according to the fourth embodiment will be described below.

Figure 19:
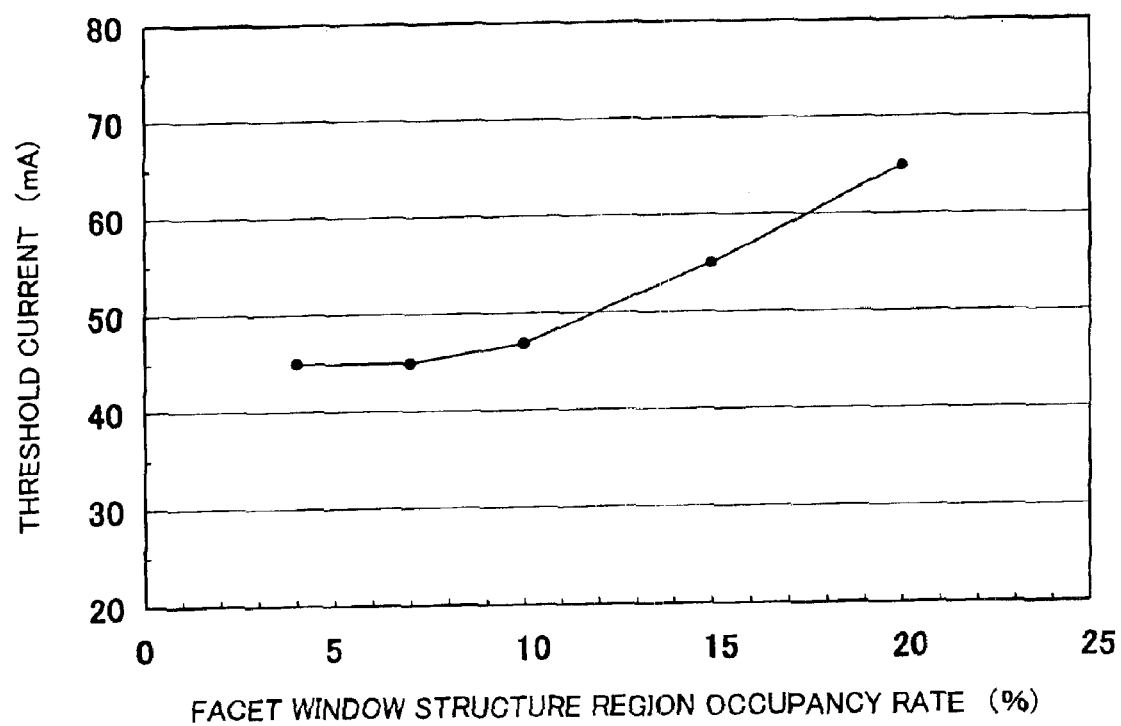
FIG. 19 is a graph showing the relationship between the threshold current and facet window structure occupancy rate of a selectively grown GaN based laser (a laser device G) according to a fourth embodiment of the invention.

The current-optical power properties of each laser device G were measured. FIG. 19 shows the relationship between threshold current and facet window structure region occupancy rate. It is understood from FIG. 19 that when the occupancy rate is 10% or less, the increase of threshold current is not noticeable but when the occupancy rate exceeds 10%, the length of the resonator is substantially reduced, resulting in an increase in threshold current. The increase of threshold current leads to an increase in operating current in the life test conducted with a constantly output optical power of 30 mW and therefore to a decrease in durability. It has been found from the above facts that the facet window structure region occupancy rate of the laser devices G is preferably 10% or less.

Fifth Embodiment

The fifth embodiment of the invention is associated with a method for fabricating a GaN based semiconductor laser, wherein both the low dislocation density structure and the facet window structure useful for suppression of COD generation at the laser resonator facets are achieved with high yields at low cost by carrying out selective growth, in the crystal growth of a semiconductor laser, through the above layered film thickness control method using an insulating film having different open area ratios.

The method for fabricating GaN based laser of the fifth embodiment of the invention will be hereinafter described.

The procedures for crystal growth, electrode formation and cleavage of the fifth embodiment are similar to those of the third embodiment. It should be noted that while the area where the dielectric film is adhered to the electrode side is located within the facet window structure region in the first embodiment, the position of the dielectric film adhering area is varied in the fifth embodiment. The packaging procedure of the fifth embodiment is the same as that of the first embodiment. By controlling the height of the silicon bar during spattering of the dielectric film, the dielectric film adhering area is positioned in the place covering the resonator facet as well as the regions within 15, 25, 50, 75 $\mu$m from the resonator facet. It should be noted that the dielectric film adhering area located in the place covering the resonator facet and the region within X $\mu$m from the resonator facet is hereinafter referred to as "X $\mu$m dielectric film adhering area". Herein, the laser device having, at both ends, a 25 $\mu$m dielectric film adhering area is the laser device E described earlier.

The properties of laser devices H, I and J (dielectric film adhering area: 15, 50, 70 $\mu$m) thus prepared will be described below.

Figure 20:
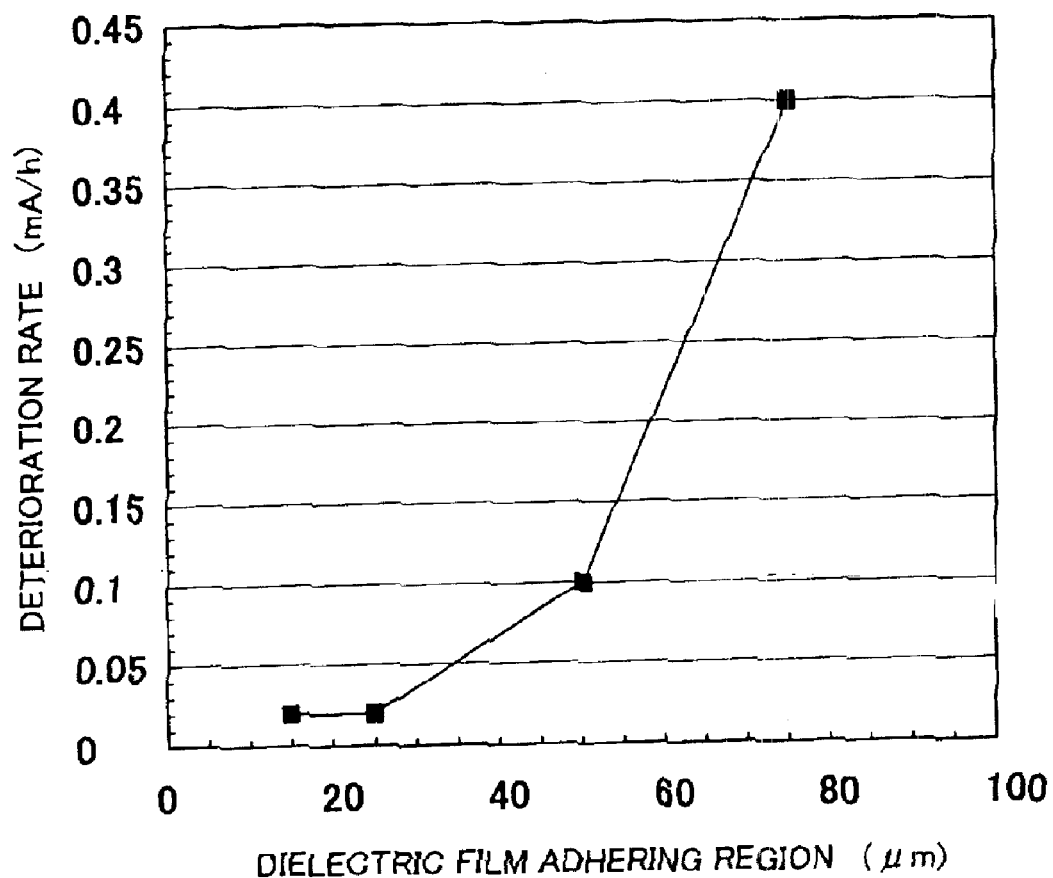
FIG. 20 is a graph showing the relationship between the degradation rate and dielectric film adhered region of selectively grown GaN based lasers (laser devices E, H to J) according to a fifth embodiment of the invention.

The current-optical power properties of the laser devices H, I, J are generally similar to those of the laser device E. Next, a life test was conducted on the laser devices H, I and J at room temperature with a high optical power of 30 mW being constantly output. The deterioration rates of the laser devices H, I, J were about 0.02 mA/h, 0.1 mA/h and 0.4 mA/h, respectively. On the other hand, the deterioration rate of the laser device E was about 0.02 mA/h like the laser device H. FIG. 20 shows the relationship between the deterioration rate of each laser device and the dielectric film adhering region. Next, the laser device J was dismounted from the sub-mount and the condition of the solder adhered to the surface of the laser device was observed using an SEM (not shown). It was found that the solder did not adhere to the dielectric film adhering area and therefore it was anticipated that, in this region, heat dissipation deteriorated, affecting the service life of the laser device. It is understood from the above fact that by designing the dielectric film adhering area to be located within the facet window structure region and the facet current non-injection region, deterioration of heat dissipation in a laser device can be restrained so that long service life can be ensured. Although facet coating is applied to the rear facet of the laser resonator in the embodiments of the invention, the above effect can be attained by coating the front facet (light outputting side) of the laser resonator with a low reflective film, protective film or highly reflective film. This effect can be also obtained in the laser device F.

Numerous modifications and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention and all modifications which come within the scope of the appended claims are reserved.

What is claimed is:

1. A method for fabricating a semiconductor light emitting device, the method comprising the steps of:
   (A) repeatedly forming, on a first nitride based Group III–V compound semiconductor layer, stripe-shaped masking films in a predetermined cycle in a width-wise direction thereof, each masking film comprising first width sections having a predetermined width and second width sections which are adjacent to both ends of each first width section and have a greater width than the predetermined width;
   (B) selectively growing a second nitride based Group III–V compound semiconductor layer from exposed parts of a surface of the first nitride based Group III–V compound semiconductor so as to cover the masking films and the exposed parts, each of the exposed parts being located between the masking films; and
   (C) layering a semiconductor laser structure on the second nitride based Group III–V compound semiconductor layer, the semiconductor laser structure including an active layer which substantially extends in a lengthwise direction of the masking films and level difference portions which extend in the width-wise direction by a structure in which a portion located above the second width sections is lower than a portion located above the first width sections.

2. The method for fabricating a semiconductor light emitting device according to claim 1, wherein in the semiconductor laser structure, the level difference portions are formed such that the active layer of the portion located above the first width sections is joined to other semiconductor layers than the active layer of the portion located above the second width sections.

3. The method for fabricating a semiconductor light emitting device according to claim 2, wherein in the semiconductor laser structure, the level difference portions are formed such that the active layer of the portion located above the first width sections is joined to a semiconductor layer having higher bandgap energy than the active layer of the portion located above the second width sections.

4. The method for fabricating a semiconductor light emitting device according to claim 3, wherein the semiconductor laser structure includes cladding layers between which the active layer is sandwiched in a layering direction, and the semiconductor layer having higher bandgap energy than the active layer is the cladding layers.

5. The method for fabricating a semiconductor light emitting device according to claim 1, wherein each of the masking films consists of an insulating film.

6. The method for fabricating a semiconductor light emitting device according to claim 1, wherein when layering the semiconductor laser structure in the step (C), ridges are formed to extend in the length-wise direction of the masking films and to be located above the respective masking films.

7. The method for fabricating a semiconductor light emitting device according to claim 1, wherein the difference in width between the first width sections and second width sections of the masking films is 16% or more and 84% or less of the predetermined width of the first width sections.

8. The method for fabricating a semiconductor light emitting device according to claim 1, wherein, in the semiconductor laser structure, a percentage of the distance between a facet of a resonator and the level difference portion to a length of the resonator is 10% or less.

9. The method for fabricating a semiconductor light emitting device according to claim 1, wherein the portion of the semiconductor laser structure located above the second width sections has a current non-injection structure.

10. The method for fabricating a semiconductor light emitting device according to claim 9, wherein the current non-injection structure is obtained by forming no electrodes at the portion of the semiconductor laser structure located above the second width sections.

11. The method for fabricating a semiconductor light emitting device according to claim 9, wherein the current non-injection structure is obtained by forming an insulating layer under an electrode at the portion of the semiconductor laser structure located above the second width sections.

12. The method for fabricating a semiconductor light emitting device according to claim 9, wherein, in the semiconductor laser structure, a region where a dielectric film for coating a facet of a resonator is adhered is located within the portion of the semiconductor laser structure located above the second width sections.

13. The method for fabricating a semiconductor light emitting device according to claim 12, wherein the dielectric film is a dielectric multilayer film which behaves as a highly reflective film to laser light generated in the laser structure.

14. The method for fabricating a semiconductor light emitting device according to claim 12, wherein the dielectric film behaves as a low reflective film to laser light generated in the laser structure.

15. The method for fabricating a semiconductor light emitting device according to claim 12, wherein the dielectric film is a film for protecting a facet of the resonator from pollution.

16. The method for fabricating a semiconductor light emitting device according to claim 1, wherein the nitride based Group III–V compound semiconductor is a GaN semiconductor.

17. The method for fabricating a semiconductor light emitting device according to claim 1, wherein the first nitride based Group III–V compound semiconductor layer is formed on a sapphire substrate.

18. The method for fabricating a semiconductor light emitting device according to claim 1, wherein the second nitride based Group III–V compound semiconductor grows from the spaces between the masking films onto the masking films substantially in parallel with a main surface of the substrate.

19. The method for fabricating a semiconductor light emitting device according to claim 1, wherein, in the second nitride based Group III–V compound semiconductor layer, a dislocation density of the portion grown on the masking films is lower than the dislocation density of a portion grown between the masking films.

20. The method for fabricating a semiconductor light emitting device according to claim 1, wherein portions of the second nitride based Group III–V compound semiconductor layer which have grown on the respective width sections of the masking films are planarized.

* * * * *

UNITED STATES PATENT AND TRADEMARK OFFICE
CERTIFICATE OF CORRECTION

PATENT NO. : 6,884,648 B2  Page 1 of 1
DATED : April 26, 2005
INVENTOR(S) : Yoshiaki Hasegawa et al.

It is certified that error appears in the above-identified patent and that said Letters Patent is hereby corrected as shown below:

Title page,
Item [56], References Cited, OTHER PUBLICATIONS,
"Shuji Nakamura" 1st reference, change the phrase ""InGaN Multiquantium-" to
-- "InGaN Multiquantum --; and change "Strained-Layer Superlatticses" to
-- Strained-Layer Superlattices --;
"H. Marchand" reference, change "Lateral Expilaxial" to -- Lateral Epitaxial --;
"Shuji Nakamura" 2nd reference, change ""InGaN/GaNAL/GaN" to
-- InGaN/GaN/AlGaN --; and change "Superlatices" to -- Superlattices --.

Signed and Sealed this

Thirteenth Day of September, 2005

JON W. DUDAS
*Director of the United States Patent and Trademark Office*